United States Patent [19]
Mohsen

[11] Patent Number: 5,661,409
[45] Date of Patent: Aug. 26, 1997

[54] FIELD PROGRAMMABLE PRINTED CIRCUIT BOARD

[75] Inventor: Amr M. Mohsen, Saratoga, Calif.

[73] Assignee: Aptix Corporation, San Jose, Calif.

[21] Appl. No.: 520,326

[22] Filed: Aug. 28, 1995

Related U.S. Application Data

[60] Continuation of Ser. No. 863,460, Apr. 3, 1992, abandoned, which is a division of Ser. No. 410,194, Sep. 20, 1989, Pat. No. 5,377,124.

[51] Int. Cl.$^6$ .................................................. G01R 31/28
[52] U.S. Cl. ........................ 324/765; 324/158.1; 324/763
[58] Field of Search ........................... 324/158.1, 73.1, 324/537, 765, 763; 371/18, 22.5, 29.1

[56] References Cited

U.S. PATENT DOCUMENTS

| | | | |
|---|---|---|---|
| 3,849,872 | 11/1974 | Hubacher | 324/158.1 |
| 4,124,899 | 11/1978 | Birkner et al. . | |
| 4,146,902 | 3/1979 | Tanimoto et al. . | |
| 4,183,460 | 1/1980 | Yuen et al. | 371/22.4 |
| 4,241,307 | 12/1980 | Hong | 324/538 |

(List continued on next page.)

OTHER PUBLICATIONS

Lauther, "A Min–Cut Placement Algorithm for General Cell Assemblies Based on a Graph Representation," 16th Design Automation Conf., Jun. 25–27, 1979, pp. 1–10, reprinted in *Comp. Paps. Design Automation Conf.*, 1988, pp. 182–191.

Fiduccia et al, "A Linear–Time Heuristic for Improving Network Partitions," 19th CM/IEEE Design Automation Conf., Jun. 14–16, 1982, pp. 175–181 reprinted in *Comp. Paps. Design Automation Conf.*, pp. 241–247.

(List continued on next page.)

*Primary Examiner*—Ernest F. Karlsen
*Attorney, Agent, or Firm*—Skjerven, Morrill, MacPherson, Franklin & Friel LLP; Ronald J. Meetin

[57] ABSTRACT

A field programmable printed circuit board is provided which includes a multiplicity of component contacts for making electrical contact to the leads of electronic components to be mounted on the printed circuit board, a corresponding multiplicity of interconnect contacts for receipt of the leads on the package or packages of a programmable integrated circuit-or circuits for interconnecting as desired the electronic components, and one or more layers of conductive traces formed on the printed circuit board, each conductive trace uniquely connecting electrically one component contact to one interconnect contact.

12 Claims, 21 Drawing Sheets

U.S. PATENT DOCUMENTS

| | | |
|---|---|---|
| 4,245,273 | 1/1981 | Feinberg et al. . |
| 4,357,703 | 11/1982 | Van Brunt ............................... 371/22.5 |
| 4,433,331 | 2/1984 | Kollaritsch . |
| 4,441,075 | 4/1984 | McMahon ............................... 371/22.3 |
| 4,458,197 | 7/1984 | Robinson ............................... 324/73.1 |
| 4,486,705 | 12/1984 | Stopper ............................... 324/73.1 |
| 4,578,773 | 3/1986 | Desai et al. ............................... 371/29.1 |
| 4,638,246 | 1/1987 | Blank et al. ............................... 324/500 |
| 4,729,124 | 3/1988 | Hansel et al. ............................... 371/18 |
| 4,749,947 | 6/1988 | Gheewala ............................... 371/22.6 |
| 4,779,340 | 10/1988 | Kihm et al. ............................... 29/847 |
| 4,840,924 | 6/1989 | Kinbara . |
| 4,855,253 | 8/1989 | Weber ............................... 324/537 |
| 4,860,165 | 8/1989 | Cassinelli . |
| 4,866,432 | 9/1989 | Goetting . |
| 4,870,302 | 9/1989 | Freemen . |
| 4,894,605 | 1/1990 | Ringleb et al. ............................... 324/537 |
| 4,956,602 | 9/1990 | Parrish ............................... 324/537 |
| 4,961,053 | 10/1990 | Krug ............................... 324/537 |
| 5,015,885 | 5/1991 | El Gamal et al. . |
| 5,036,473 | 7/1991 | Butts et al. ............................... 364/489 |
| 5,107,146 | 4/1992 | El-Ayat . |
| 5,109,353 | 4/1992 | Sample et al. ............................... 364/578 |
| 5,231,588 | 7/1993 | Agrawal et al. . |
| 5,253,181 | 10/1993 | Marui et al. . |
| 5,255,203 | 10/1993 | Agrawal et al. . |
| 5,295,082 | 3/1994 | Chang et al. . |

OTHER PUBLICATIONS

Marek–Sadowska, "Two Dimensional Router for Double Layer Layout," 22nd ACM/IEEE Design Automation Conf., Jun. 23–26, 1985, pp. 117–123.

Tzeng et al, "Codar: A Congestion–Directed General Area Router," IEEE Int'l Conf. on CAD, Nov. 7–10, 1988, pp. 30–33.

Lin et al, "A Detailed Router Based on Simulated Evolution," IEEE Int'l Conf. on CAD, Nov. 7–10, 1988, pp. 38–41.

Lee et al, "A New Global Router for Row–Based Layout," IEEE Int'l Conf. on CAD, Nov. 7–10, 1988, pp. 180–183.

Bogdan, "An Electrically Programmable Silicon Circuit Board", 1987, pp. 472–476.

Hantusch, "A Programmable Interconnection Module", *IEE Colloquim Dig.*, Colloquim on IC Design–Gate Arrays, 21 Nov. 1984, pp. 8.1–8.4.

Swager, "Crosspoint–switch ICs Enter Digital Domain", Technology Update, *EDN*, Feb. 1989, pp. 75–86.

HP–12C Owner's Handbook and Problem–Solving Guide; Hewlett–Packard Company, Palo Alto, CA; 1981; pp. 220–221.

Hyden et al, "Silicon Circuit Boards: Off–the–Shelf Convenience," *Elect. Pack. & Prod.*, vol. 4, No. 2, Apr. 1988, pp. 70–74.

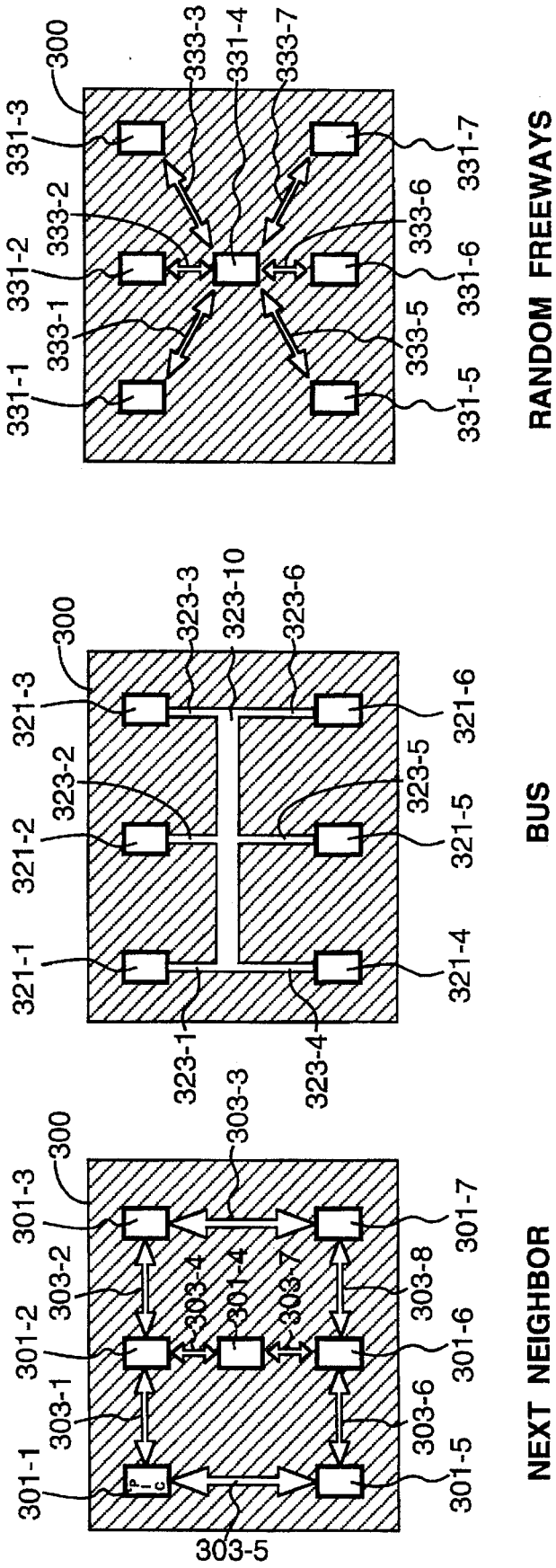
FIGURE 3d RANDOM FREEWAYS
FIGURE 3c BUS
FIGURE 3a NEXT NEIGHBOR
GLOBAL INTERCONNECT ARCHITECTURE

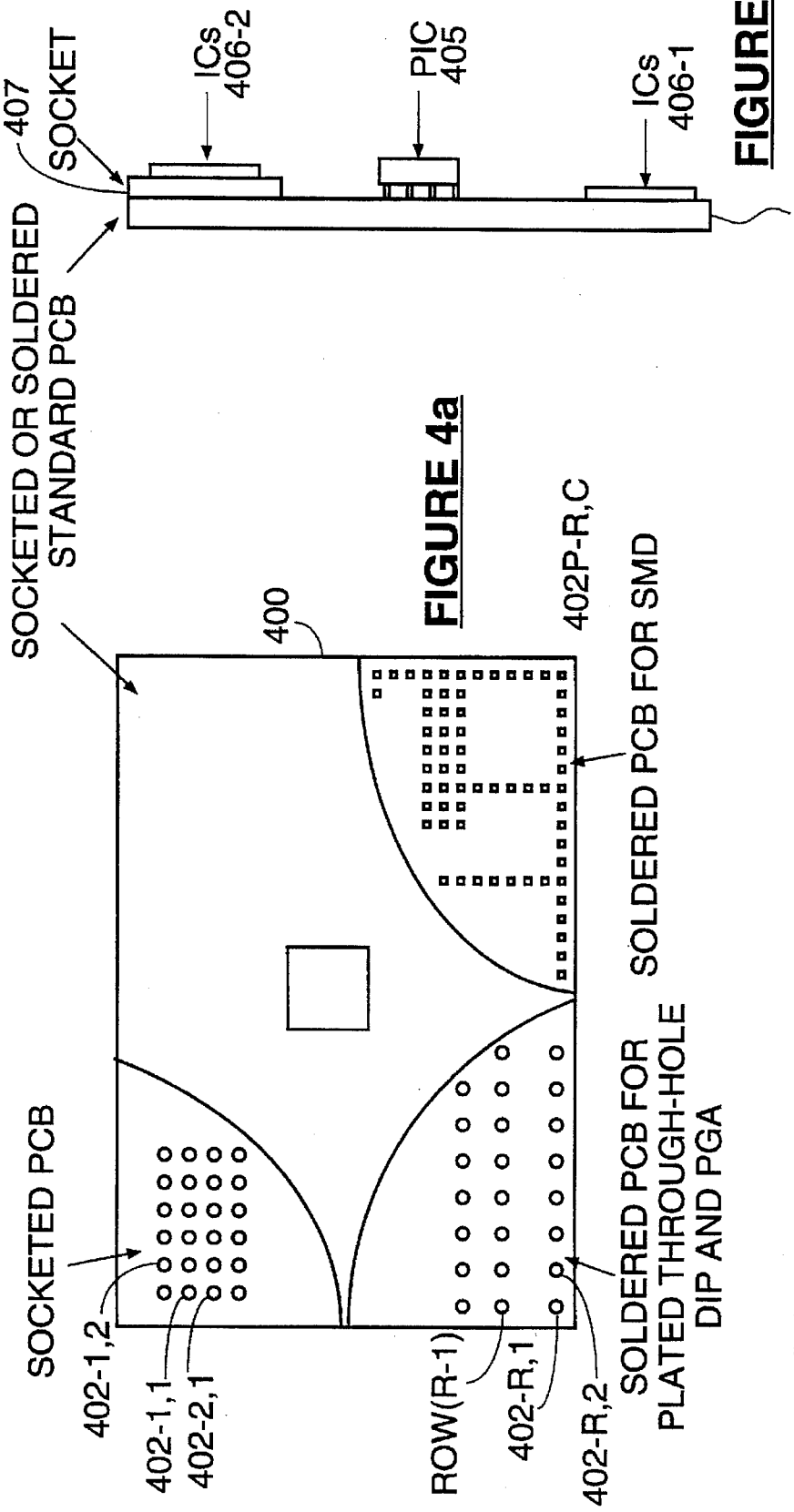

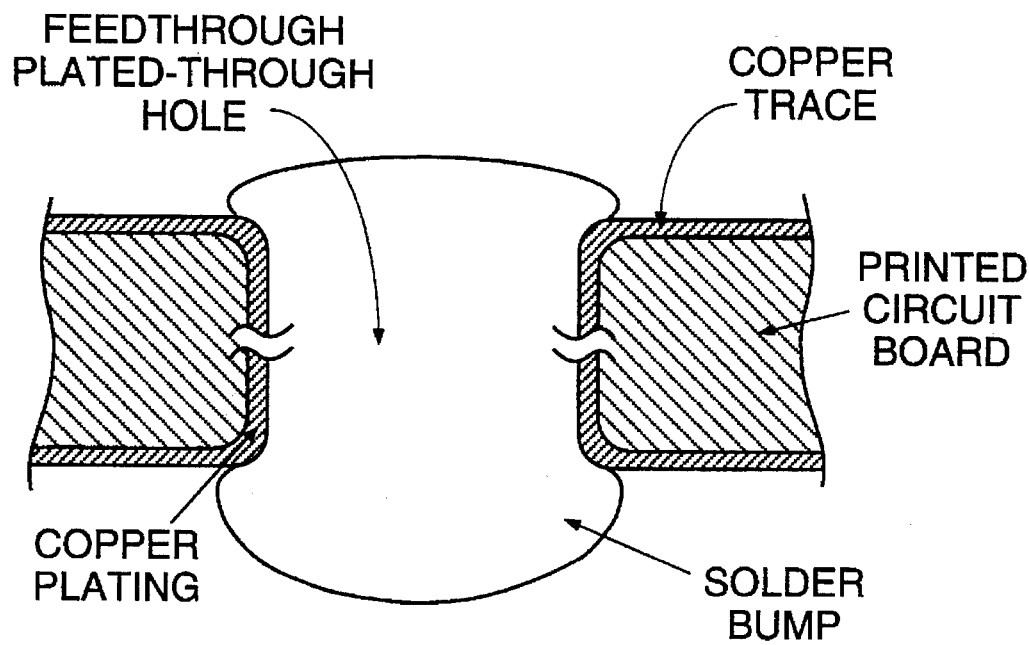
FIGURE 8b1
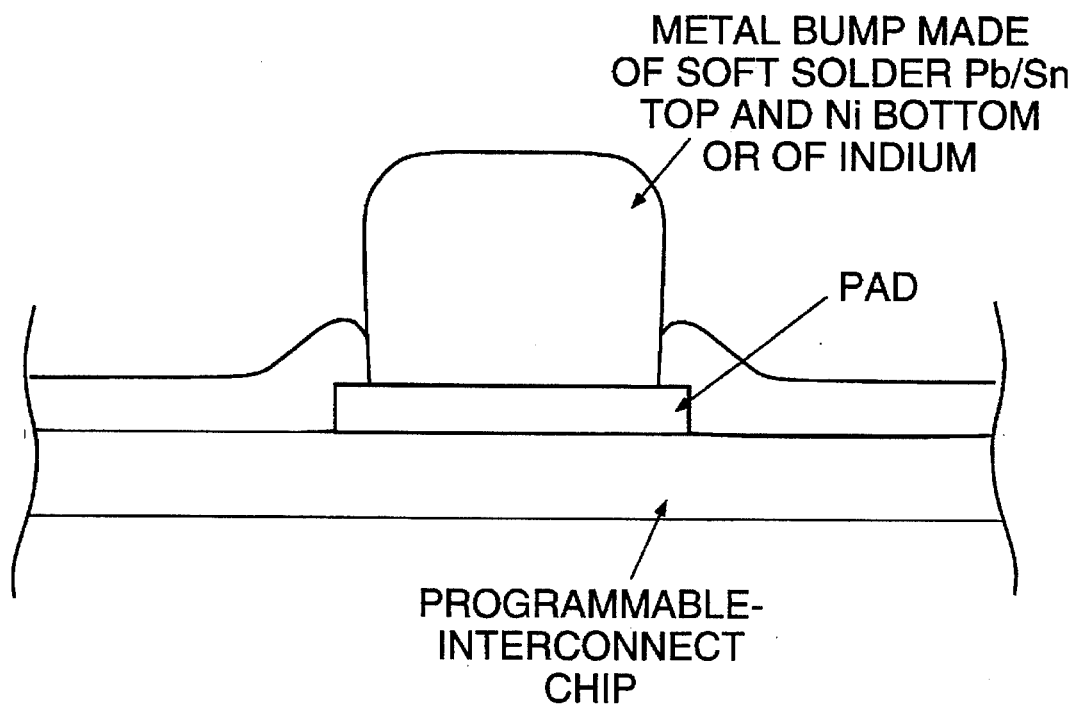
FIGURE 8b2

FIELD PROGRAMMABLE PRINTED CIRCUIT BOARD

This continuation of U.S. patent application Ser. No. 07/863,460, filed 3 Apr. 1992, now abandoned, which is a division of U.S. patent application Ser. No. 07/410,194, filed 20 Sep. 1989, now U.S. Pat. No. 5,377,124.

FIELD OF THE INVENTION

This invention relates to printed circuit boards and in particular to a printed circuit board which is programmable in the field by the designer of an electronic system to provide a desired function and to the method of programming the programmable printed circuit board of this invention.

BACKGROUND OF THE INVENTION

Printed circuit boards are commonly used in electronic devices such as instruments, computers, telecommunication equipment and consumer electronic products. Typically, an engineer will design a printed circuit board to carry the types of components necessary to implement the desired electronic function and to fit in the space available for the board. Consequently, each printed circuit board typically is custom designed. To design a custom printed circuit board is expensive, takes time and requires the fabrication of prototype printed circuit boards. If errors are found in the prototypes, then the printed circuit board must be redesigned. Such a process often delays the planned introduction of a new product.

SUMMARY OF THE INVENTION

In accordance with this invention, a printed circuit board of unique configuration is combined with one or more special programmable integrated circuit chips (hereinafter called "programmable interconnect chips" or "PICs") to provide a user programmable printed circuit board capable of being used to provide any one of a plurality of functions.

In one embodiment of the invention, a field programmable printed circuit board comprises (1) a multiplicity of component contacts for receipt of the leads of electronic components;

(2) a corresponding multiplicity of PIC contacts for receipt of the leads on the package or packages of the programmable interconnect chip or chips; and (3) one or more layers of conductive traces, each conductive trace uniquely connecting one component contact to one PIC contact.

Typically, electronic components comprise integrated circuits and/or discrete devices contained, respectively, in standard integrated circuit or discrete device packages and in addition, discrete elements which include resistors, capacitors and inductors, for example.

Generally the component contacts and PIC contacts comprise holes in the printed circuit board, the interior surfaces of which are plated to a selected thickness with a conductive material such as copper. Alternatively, these contacts are pads or any other structure for electrically and physically joining electronic components and integrated circuits to a printed circuit board. Advantageously, the PIC contacts are usually (though not necessarily) smaller than the component contacts so that the area of the programmable printed circuit board occupied by the programmable interconnect chip or chips is much smaller than the area of the printed circuit board occupied by the electronic components. Each PIC contact brings a corresponding trace from a selected level on the PC board to the surface of the PC board so that trace is then connectable to a pin or electrical contact on a programmable interconnect chip. For every component contact (the function of which is to receive the pin or electrical contact of an electronic component) there is a corresponding electrically conductive trace which interconnects that component contact to a corresponding PIC contact (the function of which is to receive the pin or electrical contact of the programmable interconnect chip) in the printed circuit board. Thus, each component contact is electrically and uniquely connected to a corresponding PIC contact for electrically contacting a programmable interconnect chip of this invention.

In accordance with this invention more than one programmable interconnect chip is, if desired, placed on a printed circuit board to provide enhanced interconnection flexibility and cost optimization for the electronic components on the printed circuit board. Such a board then has additional PIC contacts corresponding to and for connection to the external pins or electrical contacts on the additional packages containing the additional programmable interconnect chips.

The field programmable printed circuit board (hereinafter sometimes referred to as a "FPPCB") of this invention substantially reduces the cost associated with developing complex electronic systems by providing a standard PC board configuration which is easily and economically manufactured. In accordance with this invention, the designer of electronic systems utilizing the standard programmable PC board of this invention will also utilize computer aided design software to determine the optimum placement of the electronic components on the programmable PC board and to determine the configuration of the programmable interconnect chip or chips of this invention to properly interconnect the electronic components so as to yield the desired electronic system.

In accordance with the method of this invention a user designing an electronic system utilizing the programmable PC board of this invention will first place a model of the programmable PC board in the computer aided design system. The user then will simulate the placement of models of the desired electronic components, be they discrete elements, memory, logic gates, or microprocessors, on selected component contacts on the programmable PC board and will simulate the interconnection of these electronic components using the standard PC board of this invention together with the programmable interconnect chip or chips or this invention. The computer will then simulate the electrical performance of the system with the electrical components so placed and interconnected and will indicate whether or not the configuration selected by the designer yields the desired electronic function. The designer will have choices in the placement of the electronic components on the programmable PC board and in their interconnection but will be assisted in this placement by certain logical rules contained in the computer aided design program. Algorithms for use in computer aided design systems of the type required to implement the design of electronic systems utilizing the programmable PC board and programmable interconnect chip of this invention are of a type currently available in the electronic design industry.

The programmable printed circuit board of this invention is considered to be "field programmable" because the designer of an electronic system is able to program the placement of electronic components on the unique PC board of this invention by using and configuring the programmable interconnect chips of this invention. The PC board of this invention is unique in that it has a standard configuration regardless of the electronic function to be implemented and thus is relatively inexpensive and easy to make. At the same time, the field programmable PC board of this invention is programmable by use of one or more programmable interconnect chips.

In an alternative embodiment of this invention, the programmable PC board of this invention includes on a portion of its surface electronic components which are interconnected using custom designed interconnections to form a particular circuit function. Conductive traces transmit the signals from this custom portion of the PC board to one or more programmable interconnect chips on the remainder of the PC board. The programmable interconnect chip or chips are configured by the user to achieve the desired function required utilizing both the custom portion of the PC board and the programmable portion or the PC board.

Throughout this specification, the field programmable PC board of this invention will usually be described as having component holes and PIC holes for receipt of the electrical leads of the electronic components and of the programmable interconnect chip, respectively. The term "component hole" and the term "PIC hole" will be used to describe a standard hole formed in a PC board and plated with a conductive material as in the prior art to receive a conductive lead. However, any conductive structure capable of being used to electrically contact and physically hold the package of an electronic component can be used in place of a component hole or a PIC hole. Such a structure includes a solder pad and a socketed printed circuit board opening for slidably receiving and releasing the pins of an electronic component package. It should be noted that the term PIC hole is used to distinguish the function of certain holes in the programmable printed circuit board of this invention from the component holes. However, both types of holes are plated with a conductive material and have the same purpose—that is to electrically transmit signals from either the pin of the package of an electronic component to a conductive trace or from a conductive trace to the pin of an electronic component or through the programmable interconnect chip to another trace or from a conductive trace to another conductive trace.

In certain circumstances, a PIC hole or a component hole can be used to interconnect two traces directly. Such a configuration occurs in custom designed PC boards.

This invention will be more fully understood in conjunction with the following detailed description together with the attached drawings.

DESCRIPTION OF THE DRAWINGS

FIGS. 13a, 3b, 3c and 3d illustrate a number of different global interconnect architectures suitable for use with this invention;

FIGS. 4a and 4b illustrate respectively the top and side views of a programmable printed circuit board 400 constructed in accordance with this invention together with a programmable interconnect chip 405 placed on the board to interconnect the electronic components to be placed on the PC board 400 in a selected manner to provide the desired electronic function;

FIG. 4c illustrates a top view of a portion of the programmable printed circuit board 400 in FIG. 4a;

FIGS. 8a and 8b illustrate structures for connecting electronic component packages and/or a package containing a programmable interconnect chip to the programmable printed circuit board of this invention. FIG. 8b consists of FIGS. 8b1 and 8b2.

DETAILED DESCRIPTION

The following description is meant to be illustrative only and not limiting. Other embodiments of this invention will be obvious to those skilled in the art in view of this description.

Figure 1A:
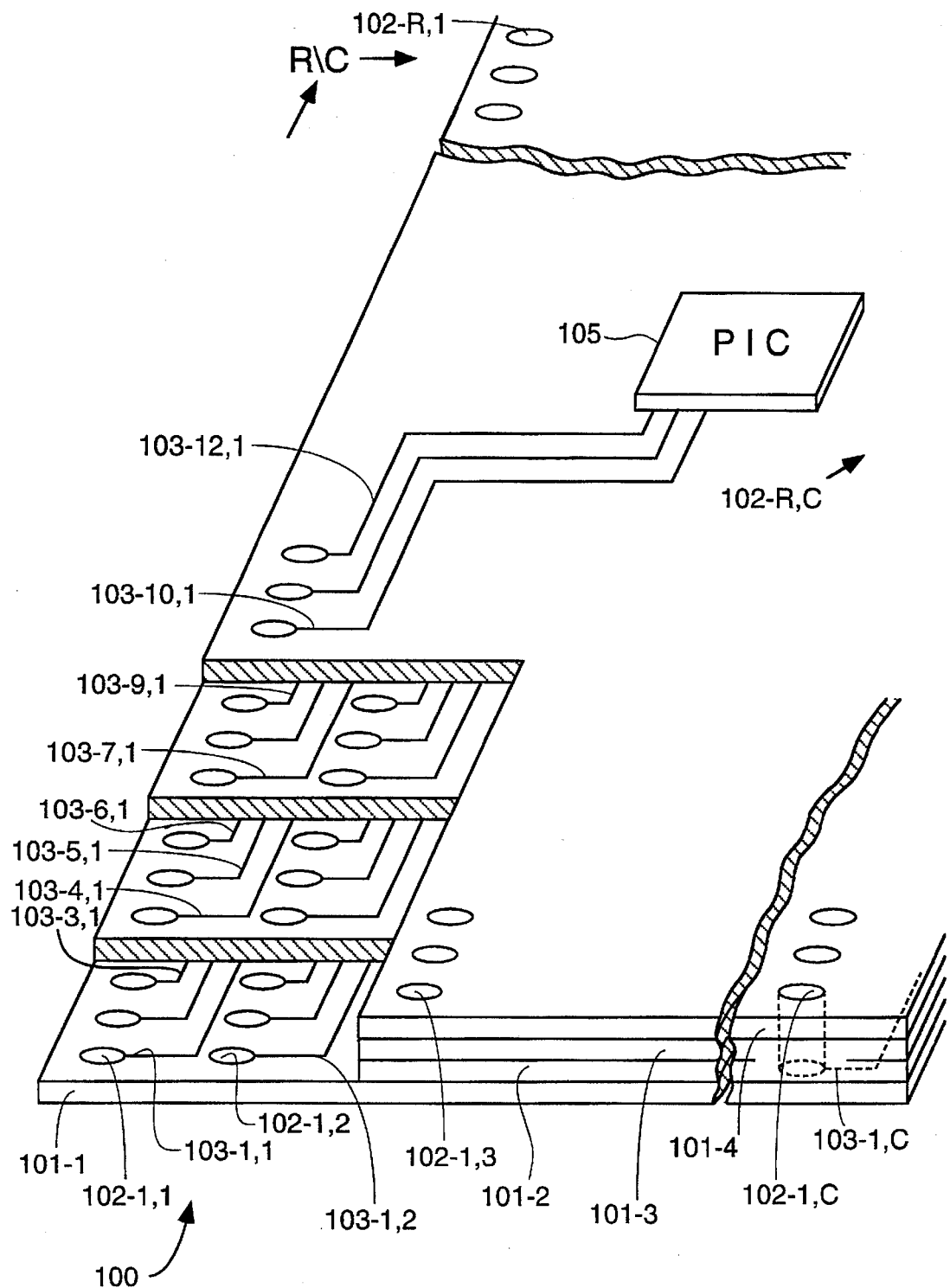
FIG. 1a illustrates in isometric view a programmable printed circuit board of this invention containing a plurality of layers of traces such as trace 103-r,c each trace connecting uniquely one component hole 102-r,c to a corresponding PIC hole 104-r,c (shown in FIG. 1b)

FIG. 1a is an isometric cross-sectional view of the programmable printed circuit board of this invention. As shown in FIG. 1a, programmable PC board 100 comprises a plurality of layers 101-1 through 101-4 of insulating material. On each layer 101-i (where $1 \leq i \leq 4$) is formed a plurality of electrical traces 103. Formed in the printed circuit board are a multiplicity of component holes 102-1,1 through 102-R,C where R represents the number of component rows of holes formed on the programmable printed circuit board and C represents the number of columns of component holes formed on the board. Thus, the programmable printed circuit board illustrated in FIG. 1a has rows of component holes 102-1,X through 102-R,X (where X is an integer which varies from 1 to C) and has columns of component holes 102-Y,1 through 102-Y,C where Y is an integer which varies from 1 to R. As shown in FIG. 1a, traces 103-1,1 through 103-1,C (not shown), 103-2,1 through 103-2,C and 103-3,1 through 103-3,C are formed on the top surface of insulating layer 101-1. Traces 103-4,1 through 103-6,C (not shown) are formed on the top surface of layer 101-2. Traces 103-7,1, through 103-9,C (not shown) are formed on the top surface of layer 101-3 and traces 103-10,1 through 103-12,C (not shown) are formed on the top surface of layer 101-4. Each trace 103-r,c (where r indicates the row and is given by $1 \leq r \leq R$ and c indicates the column and is given by $1 \leq c \leq C$) interconnects a corresponding component hole 102-r,c to a corresponding PIC hole 104-r,c (shown in FIG. 1b) connectable to a selected pin on programmable interconnect chip 105 (shown in FIG. 1a).

In the description of FIG. 1a, for simplicity not all component holes 102-r,c are actually numbered nor are all traces 103-r,c numbered. However, the numbering the component holes 102-r,c, traces 103-r,c and the PIC holes 104-r,c is consistent with each electrically connected component hole 102-r,c, trace 103-r,c and PIC hole 104-r,c all having the same indicia r,c.

Figure 1B:
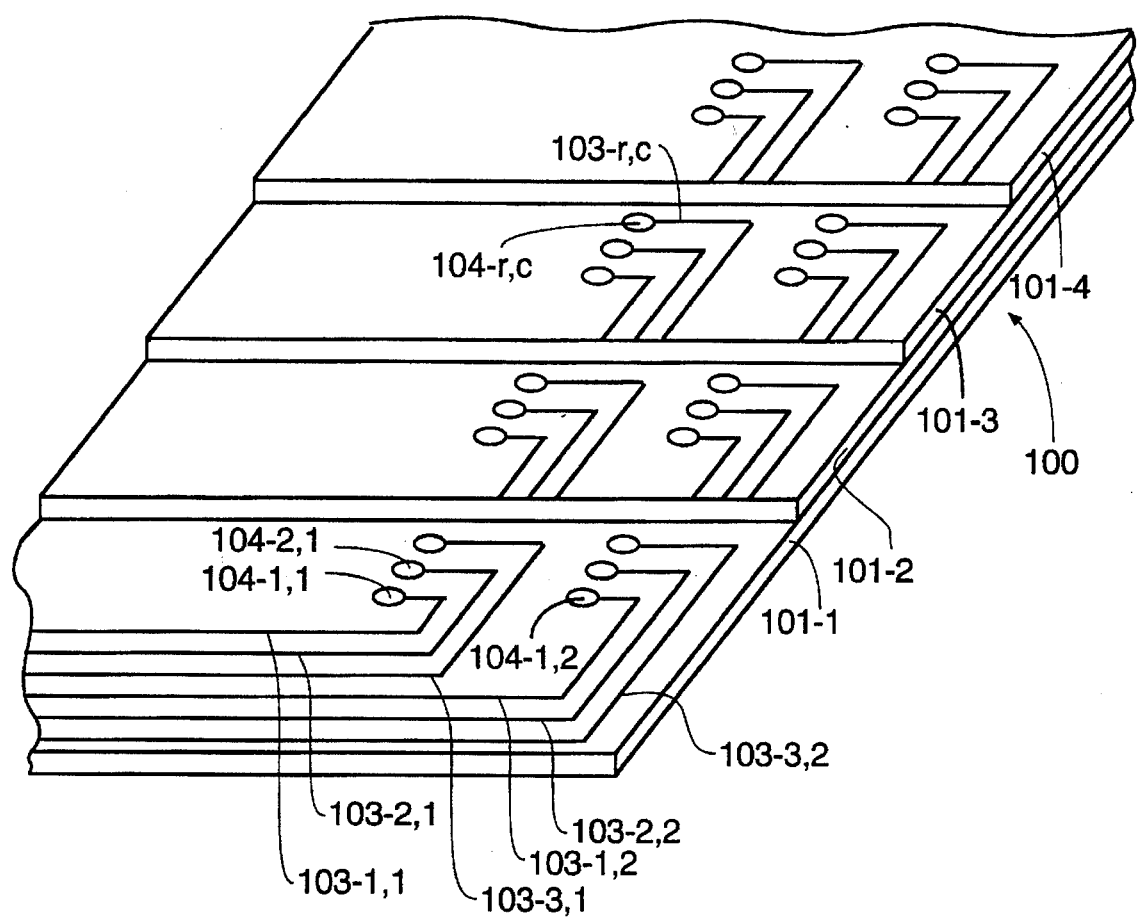
FIG. 1b illustrates an isometric view of the portion of the programmable PC board 100 of FIG. 1a beneath programmable interconnect chip 105 containing the PIC holes (such as hole 104-r,c) for connection of the traces (such as trace 103-r,c) to the pins or electrical contacts on the programmable interconnect chip 105 of this invention.

FIG. 1b illustrates PIC hole 104-r,c connected to trace 103-r,c so as to bring the electrical signal on trace 103-r,c to the top surface of layer. 101-4 of the PC board 100 for electrical contact to the programmable interconnect chip (shown in FIG. 1a but not in FIG. 1b) of this invention. FIG. 1b shows an isometric cutaway drawing of a portion of the programmable printed circuit board 100 of this invention with PIC holes 104-1,1 through 104-R,C (not shown) being arranged in a selected location on the printed circuit board 100 so as to bring to a portion of the top surface of insulating layer 101-4 of the printed circuit board 100 the electrical signals carried by traces 103-1,1 through 103-R,C. The PIC holes 104-1,1 through 104-R,C (each of which is plated on its interior surface with a conductive material) are arranged in a pattern on the printed circuit board so as to mate with the pins or other electrical connections on the package containing the programmable interconnect chip. Thus the area of the programmable PC board 100 occupied by PIC holes 104-1,1 through 104-R,C is desirably (though not necessarily) much smaller than the area of the printed circuit board occupied by component holes 102-1,1 through 102-R,C. The internal diameter of the PIC holes 104-1,1 to 104-R,C is much smaller than the internal diameter of the component holes 102-1,1 to 102-R,C and is only sufficient to allow the pins or other electrical connectors on the package of the programmable interconnect chip to make proper electrical contact to traces 103-1,1 through 103-R,C.

Figure 2A:
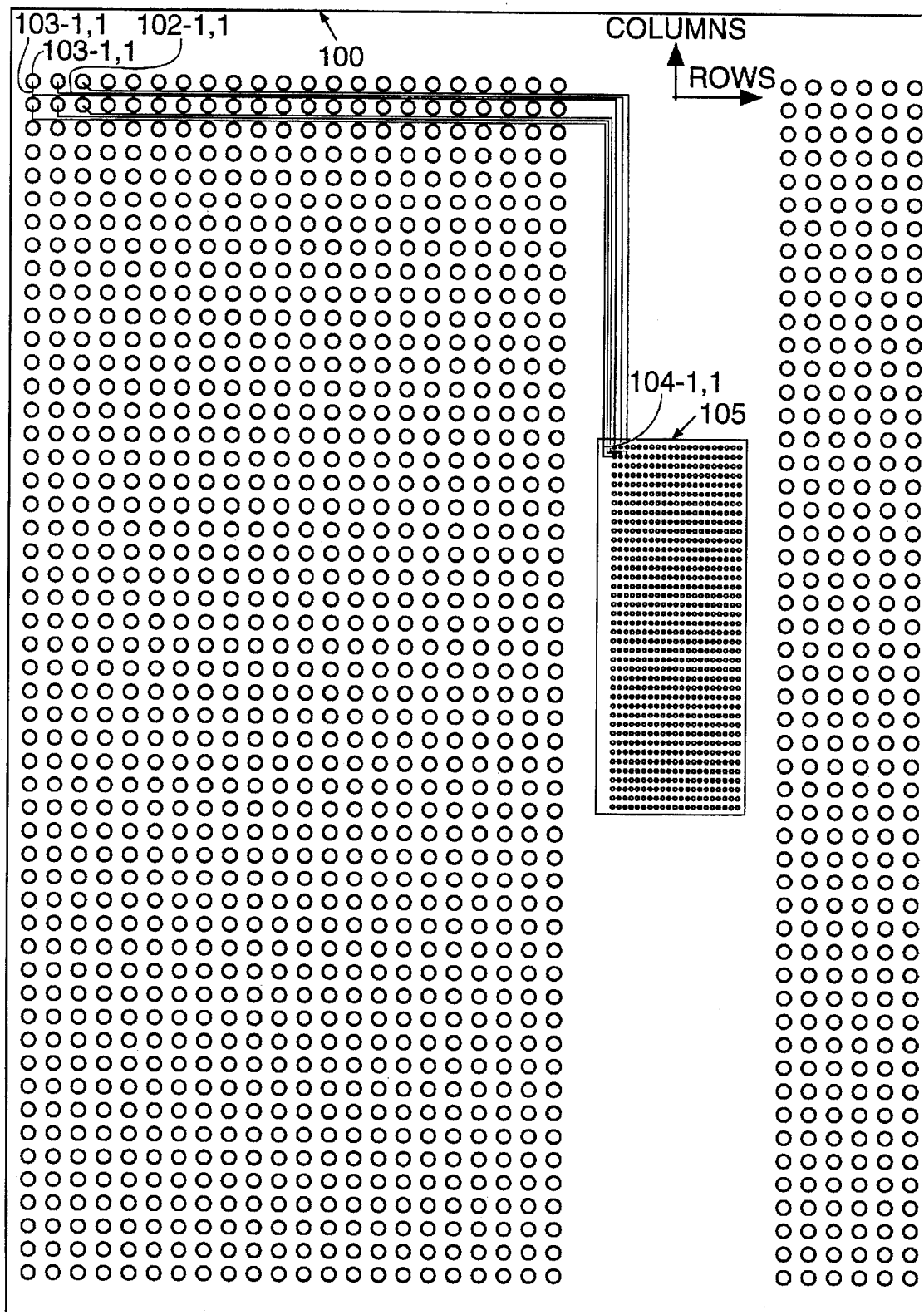
FIGS. 2a through 2d illustrate schematically four top plan views of printed circuit board 100 utilizing the programmable interconnect chip 105 of this invention together with the multiplicity of component holes 102-1,1 through 102-R,C (not shown) arranged on the printed circuit board together with a schematic representation of conductive busses 103 each bus containing a plurality of conductive traces such as traces 103-1,1 through 103-1,3 for interconnecting each of the component holes 102 to a corresponding PIC hole 104 beneath the programmable interconnect chip 105.
Figure 2B:
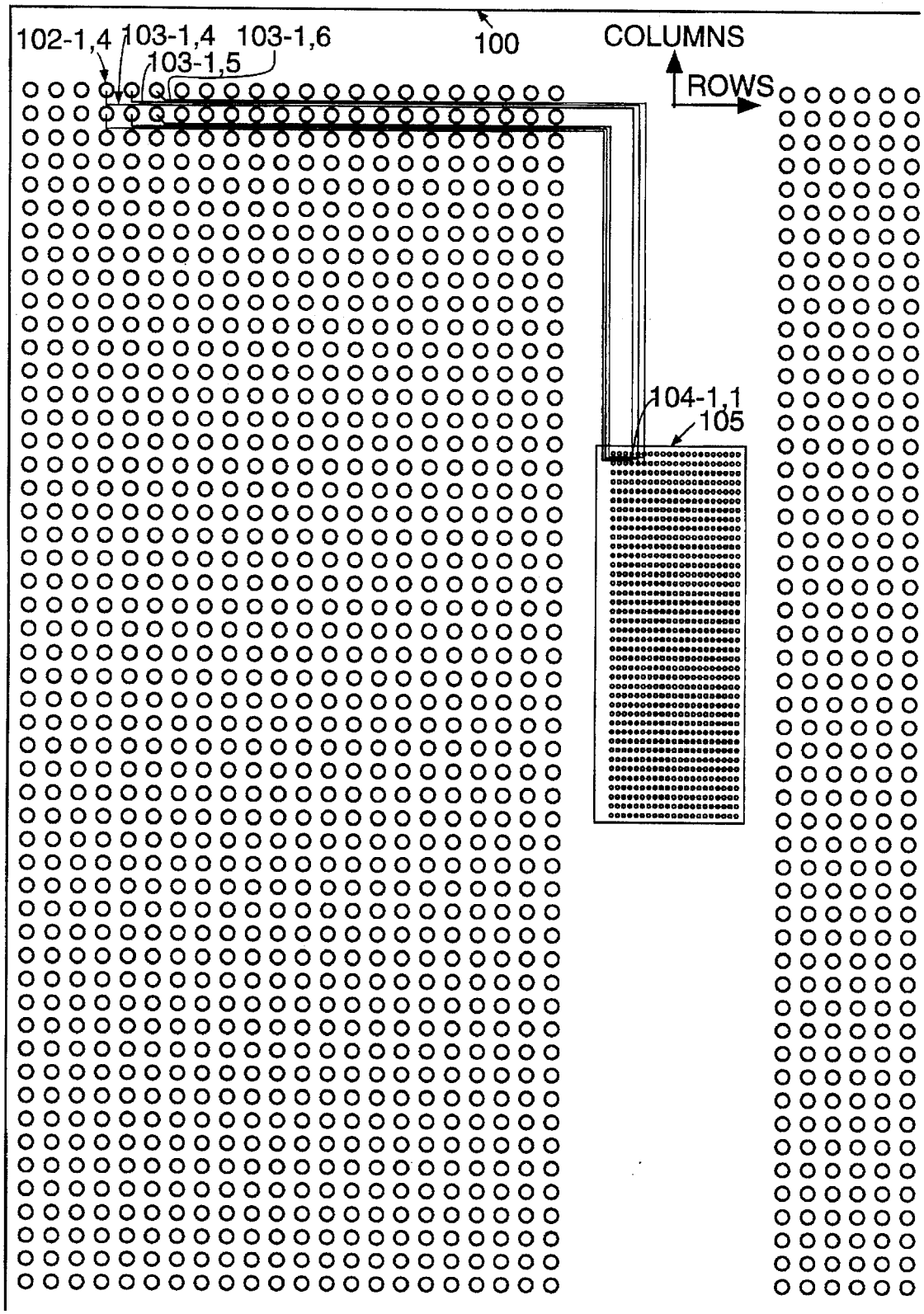
Figure 2C:
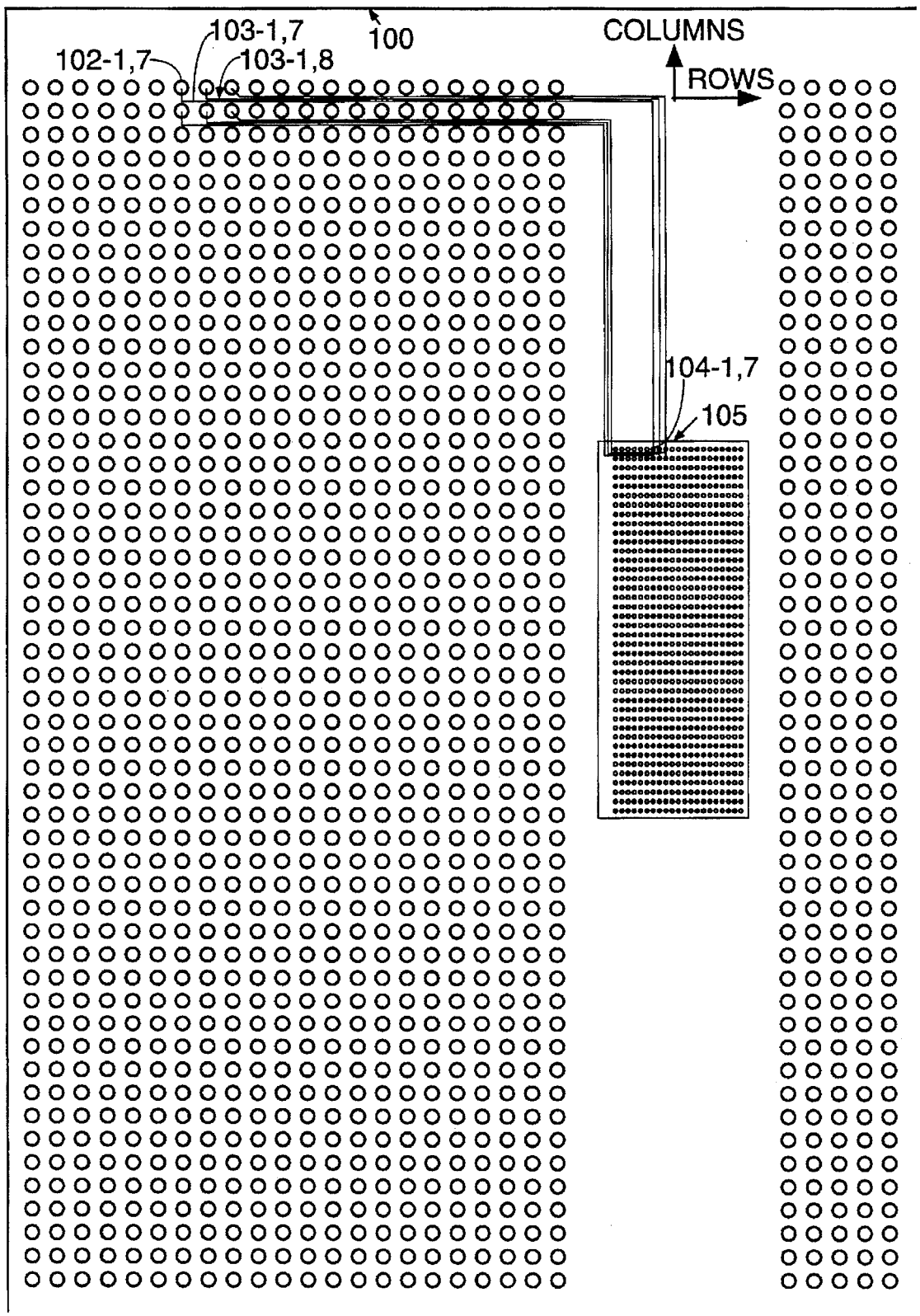
Figure 2D:
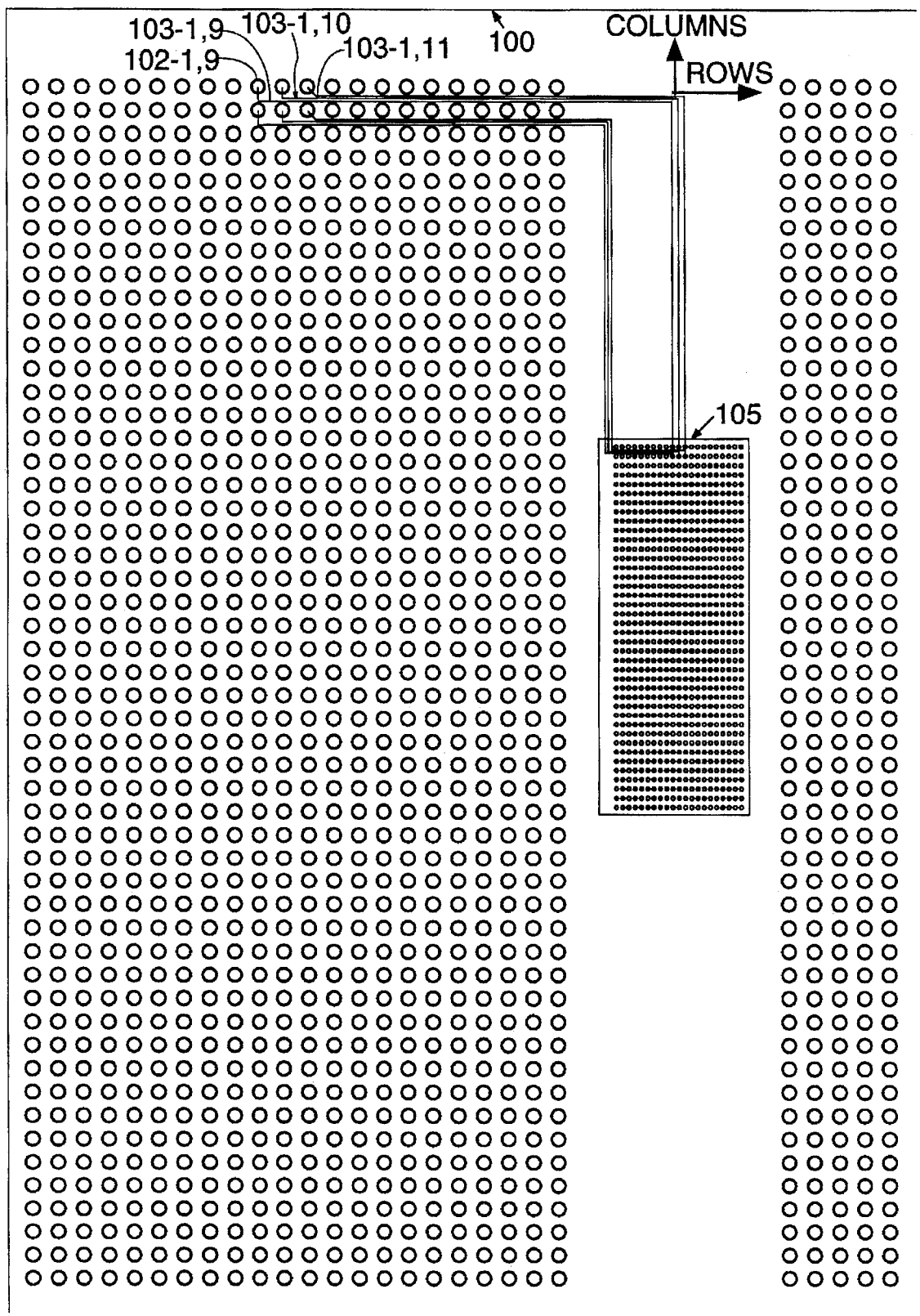

FIG. 2a illustrates in top view the local interconnect architecture of the programmable interconnect chip 105 mounted on the programmable printed circuit board 100 of this invention to show the conductive paths followed by the traces 103 interconnecting the component holes 102 to the PIC holes 104. FIG. 2a illustrates the conductive traces on one layer 101-1 of PC board 100 only. Each layer of PC board 100 will have a similar pattern of traces. The regions under programmable interconnect chip 105 to which the traces are directed differ from level to level because each trace 103-r,c uniquely interconnects one component hole 102-r,c to a corresponding PIC hole 104-r,c. FIG. 2b is similar to FIG. 2a except it illustrates schematically the trace interconnect structure to interconnect component holes 102-r,c to PIC holes 104-r,c utilizing the traces 103-r,c on printed circuit board insulating layer 101-2. Note that the traces 103 on insulating layer 101-2 interconnect different component holes 102 and PIC holes 104 than do the traces shown in FIG. 2a. Similar drawings for the interconnect traces formed on insulating layers 101-3 and 101-4 are shown in FIGS. 2c and 2d illustrating the different component holes 102-r,c being connected to the PIC holes 104-r,c by the traces 103-r,c on the layers of insulation 101-3 and 101-4.

While FIGS. 2a through 2d illustrate a programmable printed circuit board 100 utilizing one programmable interconnect chip 105 of this invention, more than one programmable interconnect chip 105 can be used with a printed circuit board 105 if desired. The printed circuit board 100 must be configured to provide a plurality of PIC holes 104 beneath each of the programmable interconnect chips 105 utilized on the PC board 100. But with this change the structure of this invention can be made even more flexible and versatile than is possible with just one programmable interconnect chip 105.

As shown in FIG. 3a a plurality of programmable interconnect chips 301-1 through 301-7 are utilized on PPCB 300. Typically, programmable PC board 300 is a multilayer PC board although in certain simple configurations a single layer programmable PC board can be used. Each chip 301-j (where j is an integer represented by $1 \leq j \leq J$) comprises a local programmable interconnect chip. A selected number of pins on chip 301-j are designated to electrically connect to the conductive traces in a bus formed on the programmable PC board 300 to interconnect that programmable interconnect chip 301-j to an adjacent programmable interconnect chip 301 such as chip 301-(j+1). Thus, in FIG. 3a, programmable interconnect chip 301-1 is capable of interconnecting any one of a plurality of electronic components (not shown) mounted on PC board 300 adjacent to PIC 300-1 with another of that plurality of electronic components. In addition, programmable interconnect chip 301-1 is also able to connect these electronic components by means of buses 303-1 and/or 303-5 to the electronic components connected to adjacent programmable interconnect chips 301-2 and 301-5, respectively. Typically, busses 303-1 and 303-5 contain eight communication channels (i.e. eight traces) or 16 communication channels or data paths (i.e., 16 traces). Of course, these data busses can contain any number of transmission channels desired depending upon the requirements of the circuitry. The particular data busses 303-1 and 303-5 are formed by means of conductive traces formed on a selected surface of PC board 300. Similarly, programmable interconnect chip 301-2 is connectable to programmable interconnect chip 301-3 and 303-4 by means of conductive busses 303-2 and 303-4, respectively. Conductive busses 303-2 and 303-4 have the same characteristics as conductive busses 303-1 and 303-5 previously described and thus will not be described in detail. Likewise, conductive busses 303-3, 303-6, 303-7 and 303-8 interconnect selected programmable interconnect chips. Thus, conductive bus 303-3 interconnects programmable interconnect chip 301-3 to programmable interconnect chip 301-7. Conductive bus 303-7 interconnects programmable interconnect chip 301-4 to programmable interconnect chip 301-6. Conductive bus 303-6 interconnects programmable interconnect chip 301-5 to programmable interconnect chip 301-6 and conductive bus 303-8 interconnects programmable interconnect chip 301-6 to programmable interconnect chip 301-7. Conductive busses 303-3 and 303-6 through 303-8 each have the same characteristics as described above in conjunction with conductive busses 303-1 and 303-5 and thus this description will not be repeated. The structure of FIG. 3a allows any electronic component on the PPCB to be interconnected with any other electronic component on the PPCB through one or more PIC's.

Figure 3B:
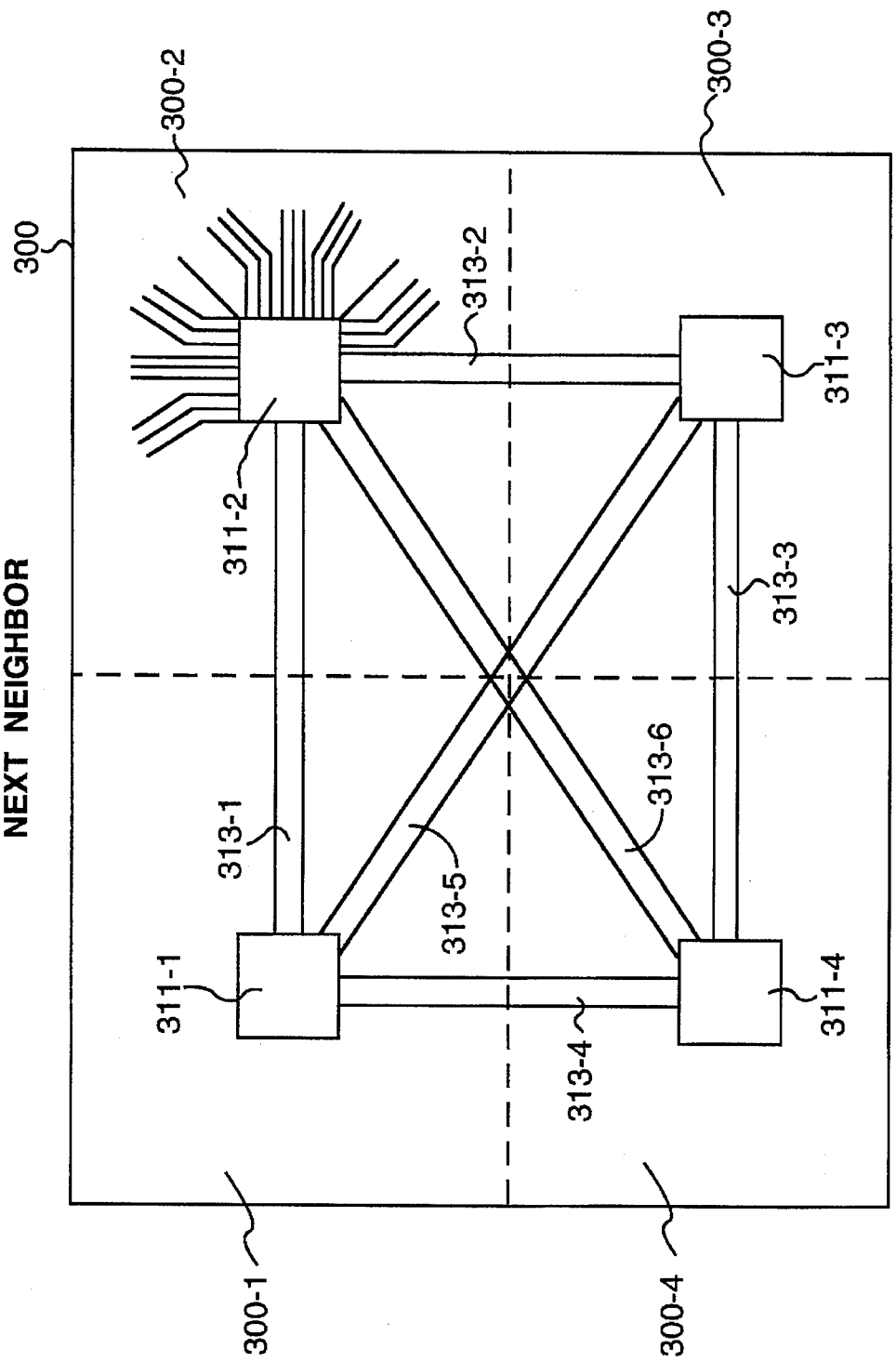

FIG. 3b illustrates a second type of interconnect system wherein programmable interconnect chips 311-1, 311-2, 311-3, and 311-4 are interconnected by means of conductive busses 313-1 through 313-6. Thus, each programmable interconnect chip 311-1 through 311-4 shown in FIG. 3b is connected directly to an adjacent programmable interconnect chip 311 by means of a dedicated conductive bus 313. For example, programmable interconnect chip 311-1 can be connected directly to programmable interconnect chips 311-2, 311-3 or 311-4 by means of conductive busses 313-1, 313-5 or 313-4, respectively. Each of these conductive busses contains a selected number of conductive lines (such as 8 or 16 conductive lines) implemented by means of 8 or 16 traces formed on a particular surface of programmable interconnect chip 300. Similarly, conductive busses 313-6, 313-2 and 313-3 have 8 or 16 conductive paths represented by traces formed one the PC board 300 and interconnect pairs of the programmable interconnect chips as shown in FIG. 3b. The advantage of the structure shown in FIG. 3b over the structure shown in FIG. 3a is that each programmable interconnect chip 311 is able to communicate directly to each of the other programmable interconnect chips 311 on the printed circuit board 300. Of course, each programmable interconnect chip 311 also interconnects a plurality of electrical components such as integrated circuits or discrete devices inserted into the programmable PC board in the area adjacent to the programmable interconnect chip 311. Thus, programmable interconnect chip 311-1 interconnects electronic components (not shown) formed in the upper left quadrant 300-1 of programmable PC board 300. Programmable interconnect chip 311-2 interconnects electronic components (not shown) inserted into the programmable PC board 300 in upper right quadrant 300-2. Programmable interconnect chip 311-3 interconnects electronic components (not shown) inserted into the programmable PC board 300 in the lower right quadrant 300-3 and programmable interconnect chip 311-4 interconnects electronic components (not shown) inserted into the lower left quadrant 300-4 of programmable PC board 300. Thus the structure of FIG. 3b is capable of electrically interconnecting the electronic components within each quadrant not only among themselves but also to the electronic components in other quadrants of the programmable PC board 300. The structure of FIG. 3b thus gives great flexibility to the circuit designer in locating the electrical components to perform a given system function.

FIG. 3c illustrates a bus configuration wherein a central bus 323-10 is formed on PC board 300 and programmable interconnect chips 321-1, 321-2, 321-3, 321-4, 321-5 and 321-6 are connected by means of conductive busses 323-1, 323-2, 323-3, 323-4, 323-5 and 323-6, respectively, to central conductive bus 323-10. Central bus 323-10 is formed by placing conductive traces on printed circuit board 300. Conductive busses 323-1 through 323-6 are similarly formed by placing conductive traces on the PC board. PC board 300 in general is a multilayer PC board with two or more layers of conductive traces. The structure shown in FIG. 3c requires the traces making up bus 323-10 to be formed on one layer of PC board 300 and the traces comprising conductive busses 323-1 through 323-6 to be formed on a second layer. Electrical contact is then made between selected ones of the traces comprising busses 323-1 through 323-6 to the traces comprising bus 323-10 by means of holes, each hole electrically contacting the two or more traces to be interconnected.

The structure of FIG. 3c simplifies the interconnections of the programmable interconnect chips 323-1 through 323-6 and improves the speed of interconnection of the common global bus signals but requires the establishment of a protocol for use of bus 323-10. Bus protocol is handled in a manner well known in the art by the programmable interconnect chips 321-1 through 321-6.

An additional interconnect structure is shown in FIG. 3d. Here, programmable interconnect chips 331-1, 331-2, 331-3, 331-4, 331-5, 331-6 and 331-7 are interconnected by means of busses 333-1, 333-2, 333-3, 333-5, 333-6 and 333-7 all of which emanate from or go to central programmable interconnect chip 331-4. Chip 331-4 is primarily or exclusively dedicated to interconnecting the programmable interconnect chips 331-1 through 331-3 and 331-5 through 331-7. If desired and if the pins are available on programmable interconnect chip 331-4, programmable interconnect chip 331-4 also interconnects electronic components mounted on the programmable PC board particularly in the regions electrically adjacent to programmable interconnect chip 331-4. Each of the programmable interconnect chips 331-1 through 331-3 and 331-5 through 331-7 interconnects electronic components mounted on the PC board in areas adjacent to the programmable interconnect chip and has a certain number of pins (depending upon the number of conductive paths in each of busses 333-1 through 333-3 and 333-5 through 333-7) dedicated to interconnecting itself, through PIC 331-4, to other programmable interconnect chips 331. The advantage of the structure in FIG. 3d is that programmable interconnect chip 331-4 can be configured to control the protocol for communication between each of the other programmable interconnect chips 331-1 to 331-3 and 331-5 to 331-7 and to improve the speed of the random global interconnections between the non-adjacent programmable interconnect chips.

FIG. 4a illustrates a programmable printed circuit board 400 of this invention containing a number of different structures for both physically and electrically connecting the electronic components to the programmable PC board 400. In the upper left hand corner of FIG. 4a, an electronic component is capable of being inserted into sockets in the PC board such that leads on the component's package electrically connect to and are physically retained by electrically conductive component holes (such as component hole 402-1,1) in the PC board. The holes are shown formed on a standard grid pattern such that one type of programmable PC board can be used regardless of the circuit function to be performed. This type of component hole, called a socketed PCB configuration, allows the electrically conductive pins on component packages to be inserted into the component holes 402 in the PC board 400 and also to be removed from these component holes 402 (such as hole 402-1,1) without destroying the package pins.

The lower left portion of PC board 400 has been configured to contain electronic component packages which are soldered into the programmable PC board 400. Typically, component holes, such as hole 402-R,1, are also used in this configuration and the holes can be placed in the board in accordance with the pin configuration of the electronic component packages to be mounted in the board. Thus one row of holes (row R-1) is shown omitted from the PC board in the lower left hand corner. The disadvantage of soldering components to the PC board is that the components cannot be easily removed. The advantage, of course, is greater structural integrity, lower cost and higher reliability. Soldered PC boards are commonly used in production to ensure high reliability and quality and lower cost in the resulting product.

The lower right hand corner of the PC board 400 in FIG. 4a comprises a solder pad configuration for the mounting of electronic components on the programmable PC board. As shown in FIG. 4c, each pad, such as pad 402P-R,C, is connected by an electrically conductive lead, such as lead 407-R,C in FIG. 4c to a component hole (such as hole 402-R,C in FIG. 4c) in the PC board to which a trace (not shown in FIGS. 4a or 4c but the same as trace 103-R,C shown in FIG. 1a) is electrically attached for connecting that component hole to a corresponding PIC hole (such as hole 104-R,C in FIG. 1b) connected to programmable interconnect chip 405 on the programmable printed circuit board. The solder pads can be formed on programmable PC board 400 in accordance with the connection configuration of the components to be mounted on the board, such as surface mounted devices.

FIG. 4b shows an end view of the structure shown in top view in FIG. 4a. Of importance, the socketed PC board can use an adaptive socket 407 of a type commonly known in the industry. For instance, appropriate sockets are produced by Aught Interconnection Systems of 40 Perry Avenue, Attleboro, Mass. 02703 and are disclosed in Chapter 7 of revision 5.0 of their July 1987 Engineering Design Guide.

Figure 5:
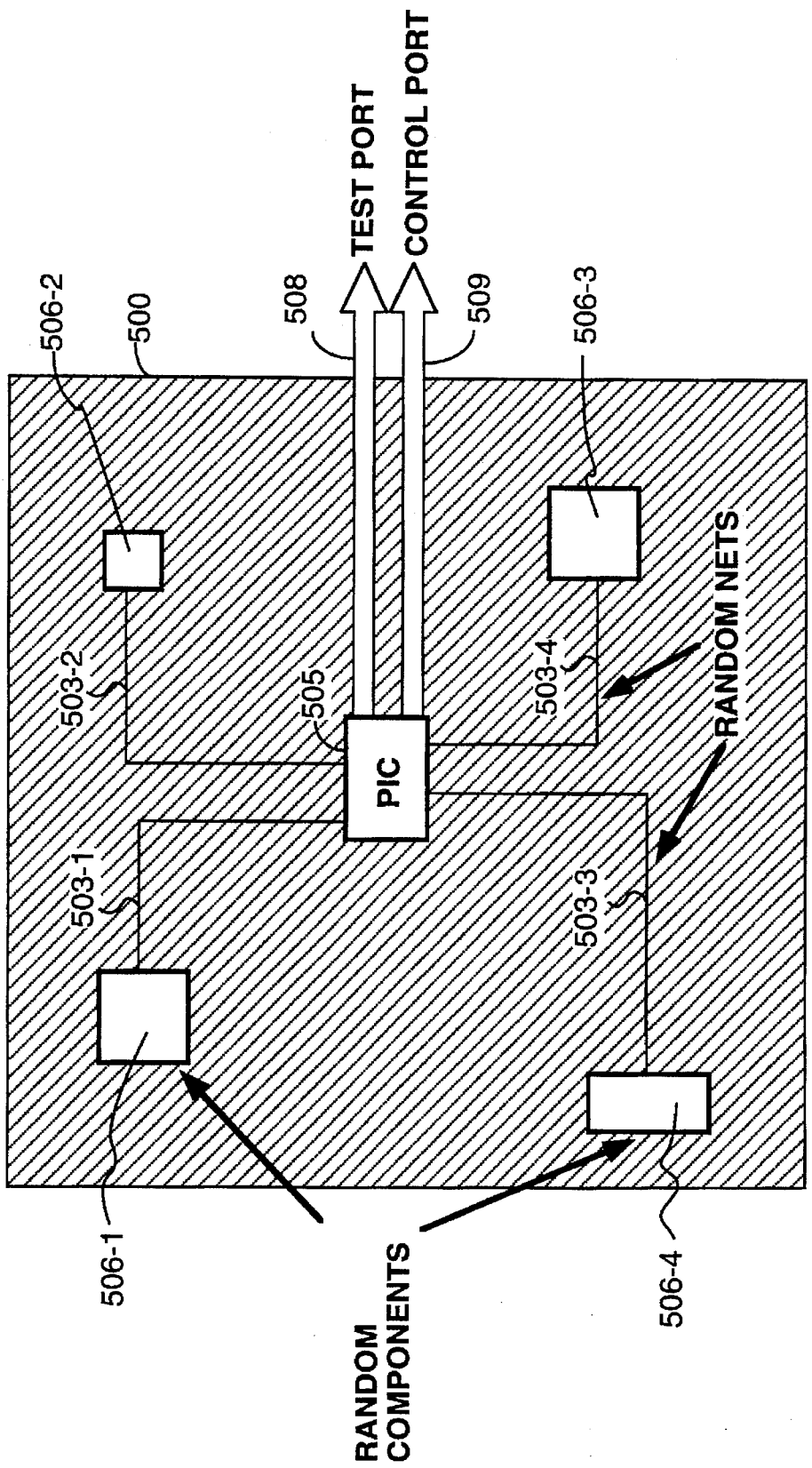
FIG. 5 illustrates a programmable printed circuit board 500 of this invention containing a test port and a control port for testing the state of each trace on the programmable printed circuit board 500 and for configuring the programmable interconnect chip 505 to interconnect in the desired manner the electronic components 506-1 through 506-4 placed on the PC board 500.

FIG. 5 illustrates a single programmable interconnect chip 505 placed on the center of programmable PC board 500. Electronic components 506-1 through 506-4 are mounted at various places on the programmable PC board 500 and are interconnected by conductive traces, shown schematically as 503-1, 503-2, 503-3 and 503-4, to programmable interconnect chip 505. Programmable interconnect chip 505, however, has two busses extending from it to ports on the edge of the printed circuit board. These ports comprise a test port 508 for the transmission of test signals from an external source such as a computer to programmable interconnect chip 505 to test the state of each conductive trace 503 coming into programmable interconnect chip 505 and a control port 509 for allowing control signals from an external source such as a computer to be transmitted to programmable interconnect chip 505 to control the configuration of programmable interconnect chip 505. The two ports 508 and 509 can be actuated simultaneously such that the computer can determine that the proper signals are present on selected traces connected to PIC 505 during the configuring of PIC 505 and during the operation of the system represented by FPPCB 500 and the attached electronic components 506-1 through 506-4 and PIC 505.

Figure 6A:
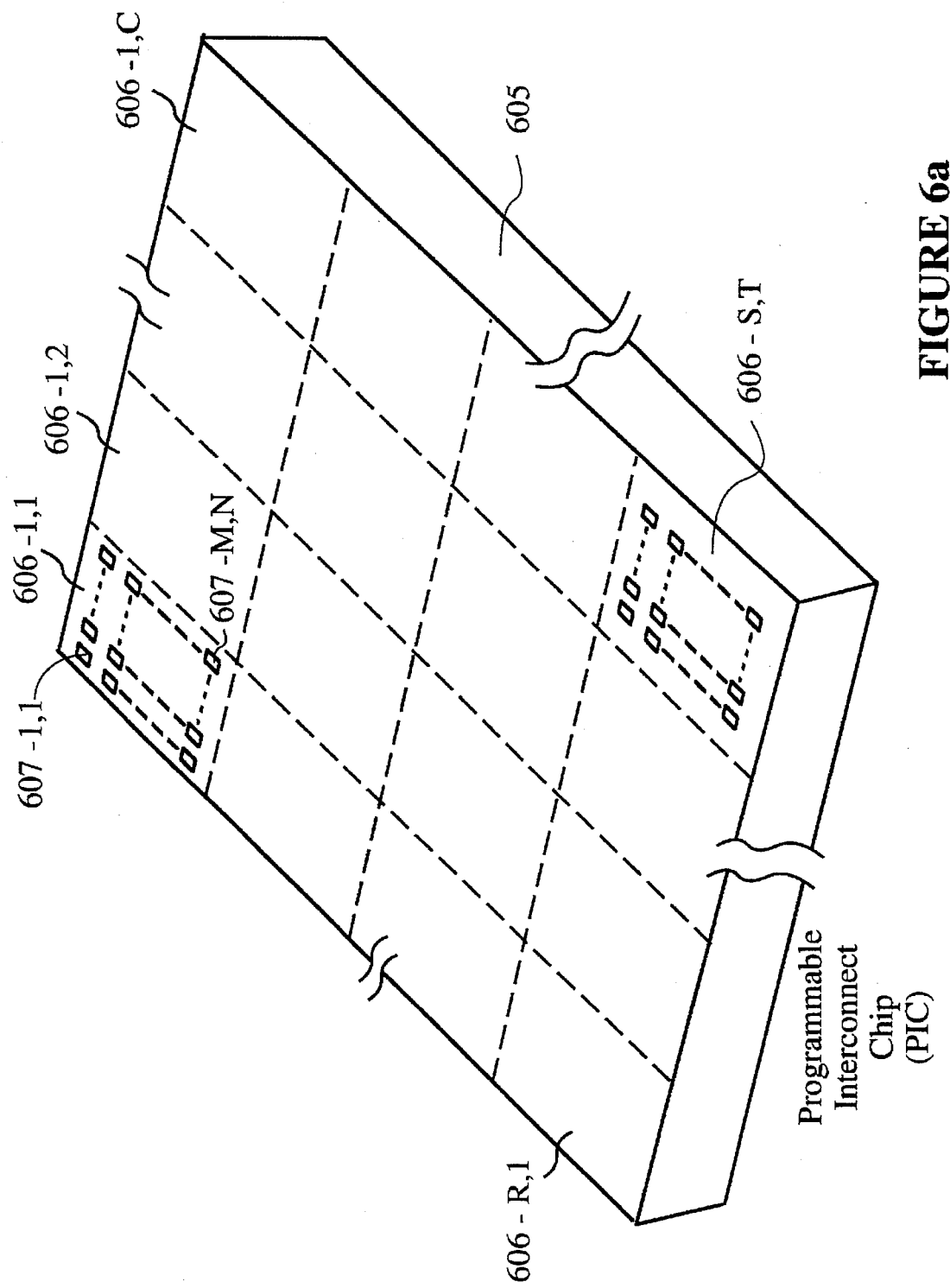
FIGS. 6a through 6e illustrate a number of structures for implementing the programmable interconnect chip 605 suitable for use in implementing the programmable PC board of this invention.
Figure 6B:
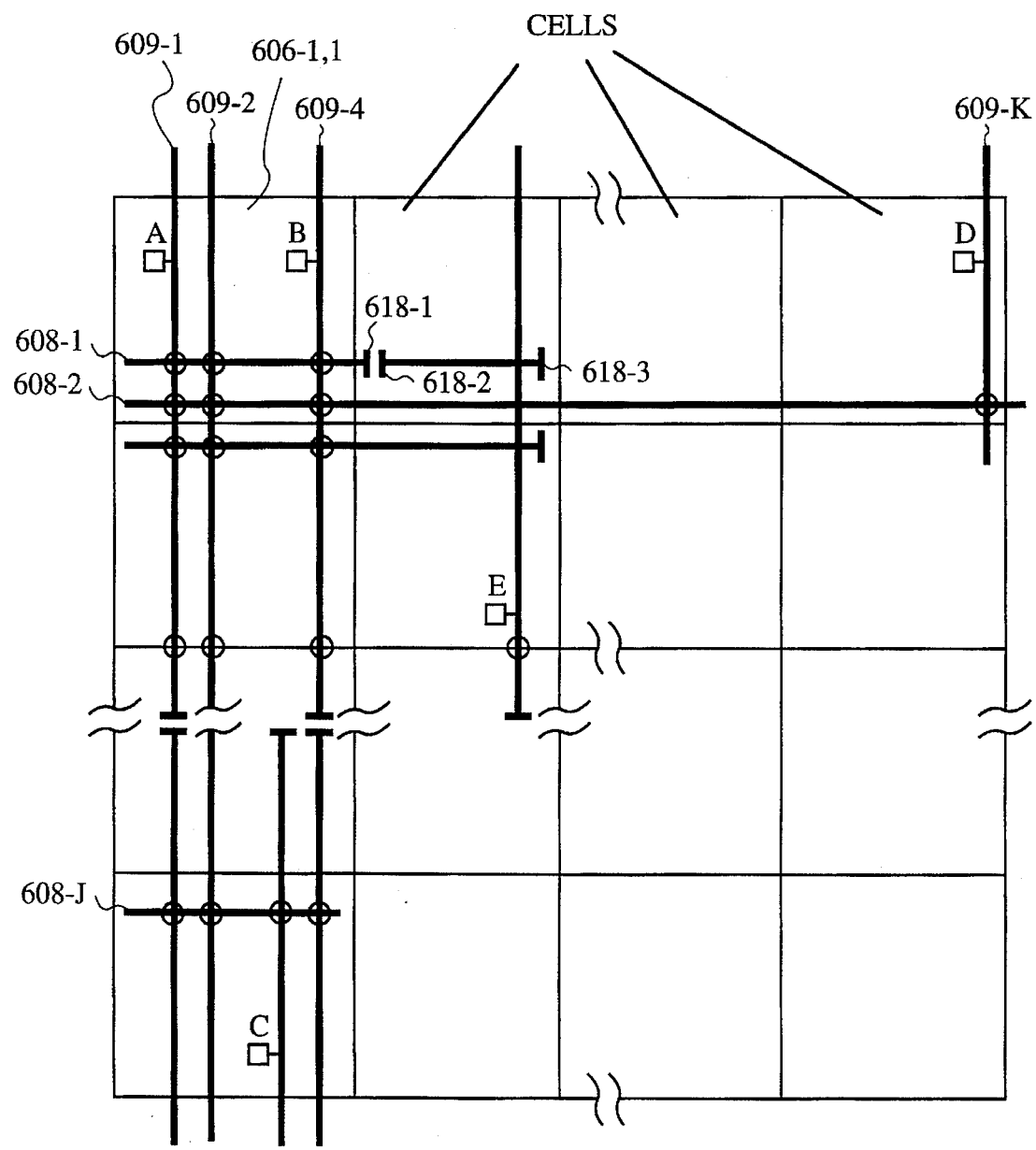

In general, the interconnection of one trace on the programmable PC board to another trace can be carried out in accordance with any one of a number of different architectures. FIGS. 6a and 6b illustrates a programmable interconnect chip 605 in accordance with this invention suitable for implementing the programmable interconnect function in the structures described above. In FIG. 6a the programmable interconnect chip 605 contains a plurality of cells 606-1,1 through 606-S,T where S represents the number of rows of cells in the programmable interconnect chip 605 and T represents the number of columns of cells in chip 605. Each cell has an array of electrically conductive pads 607-1,1 through 607-M,N where M represents the number of rows of pads in the cell and N represents the number of columns of pads in the cell. Since each cell is identical in configuration, only the conductive pads 607 associated with cell 606-1,1 will be described in detail with the understanding that the conductive pads associated with each of the other cells 606-s,t (where s is an integer given by $1 \leq s \leq S$ and t is an integer given by $1 \leq t \leq T$) in chip 605 function identically.

FIG. 6b illustrates the configuration of cell 606-1,1 and also of each of the other cells 606-s,t. In FIG. 6b horizontal conductive tracks 608-1 through 608-J (where J is an integer representing the maximum number of horizontal conductive tracks formed on programmable interconnect chip 605) are shown. In addition, vertical conductive tracks 609-1 through 609-K are shown where K is an integer representing the maximum number of columns of conductive tracks formed on programmable interconnect chip 605. The horizontal conductive tracks 608-1 through 608-J are formed on one level of interconnections on chip 605 while the vertical conductive tracks 609-1 through 609-K are formed on a second level of interconnections on chip 605. Typically, these interconnections are formed in a manner well known in the semiconductor processing arts and thus the method of forming these interconnections will not be discussed. The horizontal conductive leads 608-1 through 608-J have differing lengths across the chip. The cell 606-1,1 shown in the upper left hand corner of both FIG. 6a and FIG. 6b has a plurality of horizontal conductive leads 608 originating in and extending from cell 606-1,1 to each of the other cells 606-1,2 through 606-1,T in the same row. Likewise, cell 606-1,1 has a plurality of vertical conductive leads 609 extending from cell 606-1,1 to each of the other cells 606-2,1 to 606-S,1 in the same vertical column.

The horizontal and vertical traces 608 and 609 have at each of their intersections a programmable connective structure such as for example, an antifuse. Typically, an antifuse comprises a capacitive structure with a dielectric capable of being broken down by the application of a selected voltage to provide a conductive path between the two plates of the capacitor. Antifuses are well known in the art and thus will not be described in detail. Other kinds of programmable elements can also be used depending upon design considerations. The substrate of the programmable interconnect chip 605 has formed in it selected transistors to enable the programming of the antifuse elements at selected intersections in accordance with design requirements.

As shown in FIG. 6b, vertical leads 609-1 through 609-K are formed on the programmable interconnect chip 605 so as to extend at a minimum across one cell 606 and at a maximum across all cells. Thus a plurality of vertical leads 609 cross each cell with the lengths of leads varying from being such as to extend across just that cell to being such as to extend across all cells in a column.

Horizontal conductive leads 608-1 through 608-J likewise extend across the programmable interconnect chip 605. Again, the horizontal leads 608 extending across one cell vary in length such that they extend across only that one cell up to a length which will extend across all cells. In FIG. 6b, breaklines are included to indicate that the semiconductor chip 605 is only partially shown with interior portions of the chip having been removed for clarity. However, some conductive leads break not because of the breaklines showing removal of semiconductor material but rather because the conductive leads are intended to stop at a given point. Small lines 618-1, 618-2 and 618-3 are drawn at the terminal points of a conductive lead perpendicular to that lead to indicate that the conductive lead is intended to terminate at those points. A horizontal conductive lead thus might comprise one conductive segment each extending across the whole chip 605 or a plurality of conductive segments extending across a section of the chip. Similarly, the vertical conductive leads likewise vary from one conductive lead which will extend across the entire height of the chip or two or more conductive segments each extending across a selected portion of the chip.

The particular configuration of the conductive leads extending across one cell and from that cell to adjacent cells depends upon an analysis of the electrical functions to be carried out by the programmable printed circuit board and is selected using the most probable types of system requirements to be imposed on programmable interconnect chip 605. This selection depends upon an analysis of the circuit functions to be performed by the programmable printed circuit board of this invention and thus the actual configuration of the programmable interconnect chip is determined in light of the proposed uses for the programmable printed circuit board.

To interconnect a given lead corresponding for example to the lead 609-1 connected to pad A in cell 606-1,1 to a given lead corresponding to a different pad either in cell 606-1,1 or in some different cell using the structure shown in FIG. 6b, an interconnection between the appropriate vertical conductor 609 and the appropriate horizontal conductor 608 is formed. For example, to connect pad A to pad B (both in cell 606-1,1) the intersection of vertical lead 609-1 and horizontal lead 608-1 is programmed by applying a high voltage to this intersection in the circuit so as to break down the dielectric between these two points and form a conductive path therebetween. In addition, the intersection of vertical conductor 609-4 and horizontal conductor 608-1 is also subjected to a high voltage to break down the insulation between these two leads to form an additional conductive path between these two leads. Thus, pad A is connected to pad B by conductors 609-1, 608-1 and 609-4. Should it be desired to connect pad A to any other lead or pad then pad B will also be connected to that other lead or pad. However, such a connection must be compatible with the circuit in order to be made.

FIG. 6b also illustrates the particular connections which must be formed to connect pad A to pad D, pad A to pad C or pad A to pad E. Should all of these connections be made then pads B, D, C and E will also be connected to each other through pad A.

Figure 6C:
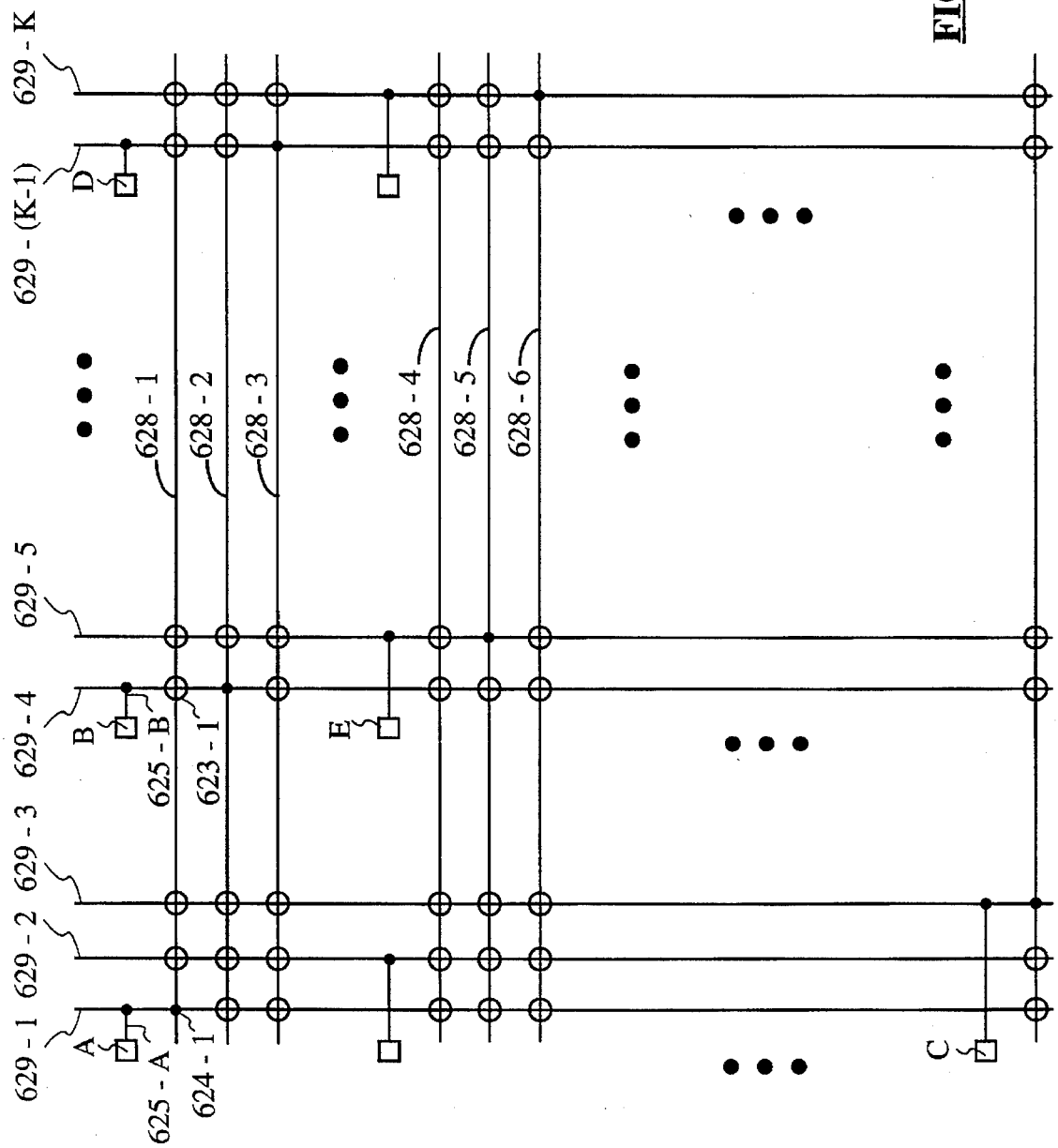

FIG. 6c illustrates a programmable interconnect chip 605 utilizing a single cross-point switch matrix array. When the number of pads to be interconnected is quite small (e.g., on the order of 100 to 300) then the structure of FIG. 6c has certain advantages of simplicity and ease of fabrication. The structure shown in FIG. 6c is simpler than that shown in FIG. 6b in that each pad (such as pad A) is connected by a conductive trace (such as conductive lead 625-A) permanently to a vertical conductive lead (such as lead 629-1. In addition, the vertical conductive lead 629-1 is permanently connected by via 624-1 (as shown by the solid dot) to horizontal conductive line 628-1. Should it be desired to connect pad A to any other pad accessible by a vertical lead 629 passing over or under horizontal lead 628-1, the circuit is programmed by applying a voltage at the correct node (such as node 623-1) to form a conductive path between desired vertical and the horizontal leads (such as horizontal lead 628-1 and vertical lead 629-4)thereby to connect pad A to pad B. Pad A is connected to vertical lead 629-4 by conductive trace 625-B. Note that each vertical line is permanently connected to one horizontal line 628 by a via (such as via 624-1). This greatly simplifies the interconnection required to program the printed circuit board of this invention since one pad can be connected to another by only one programming element. However, as the number of pads become large, this particular structure becomes relatively inefficient in its use of space on the programmable interconnect chip 605. The total number of programming elements required equals the number of pads squared.

Figure 6D:
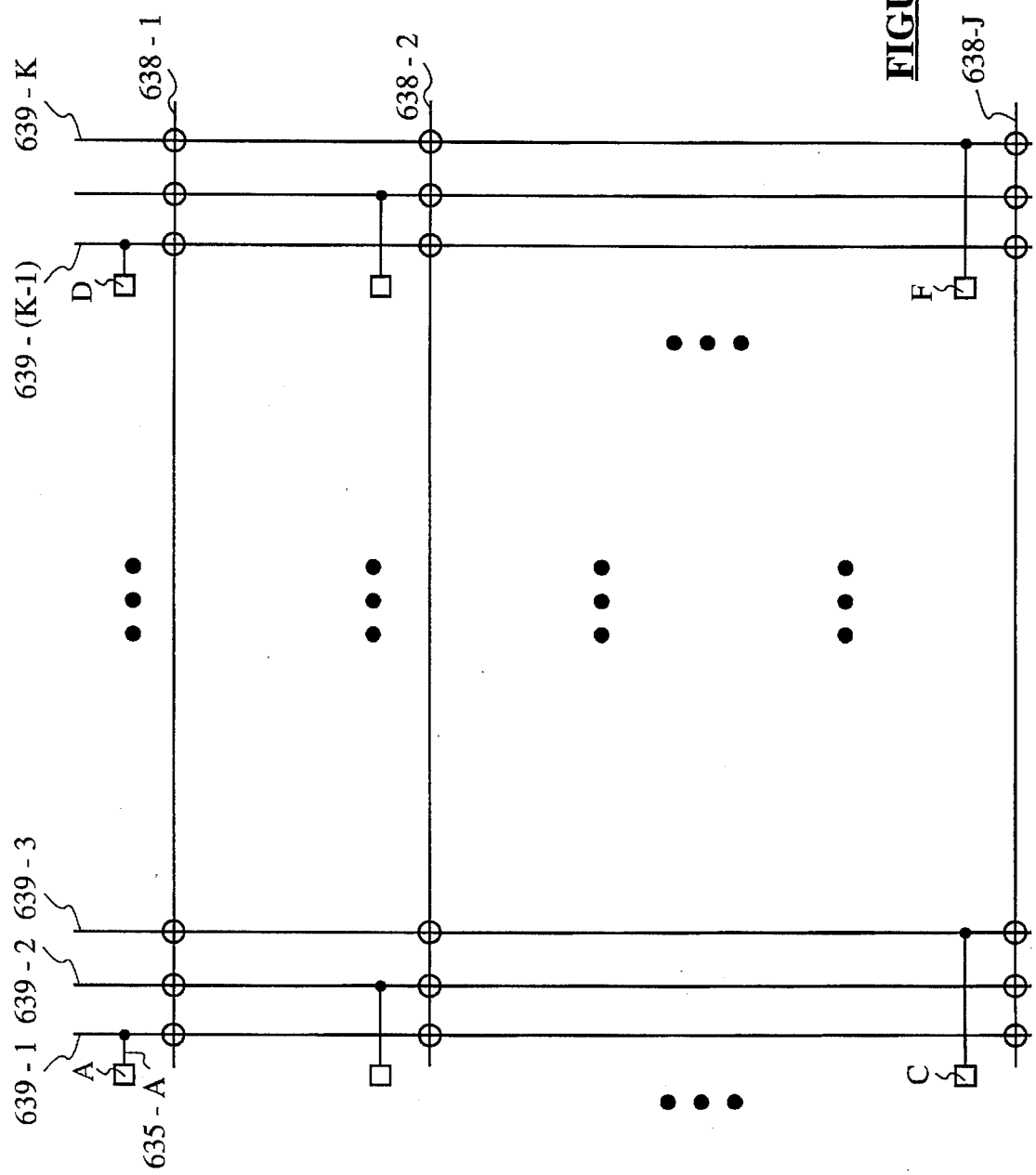

FIG. 6d shows a variation of the structure in FIG. 6c. Using the structure of FIG. 6d to interconnect pad A (which connects to a PIC hole such as hole 104-1,1 shown in FIG. 1b) to pad D (which connects to a similar PIC hole 104) two programming elements must be programmed. Thus, the element at the intersection of vertical lead 639-1 and horizontal lead 638-1 must be programmed as must the element at the intersection of vertical lead 639-(K-1) and horizontal lead 638-1. However, as shown in the structure of FIG. 6d, each conductive pad such as pad A or pad D is J19 connected by means of a conductive trace such as trace 635-A to a vertical lead 639. The number of horizontal leads is in this embodiment, less than ½ the number of vertical leads because each horizontal lead connects two pads whereas each vertical lead is connected directly to one pad only. Thus, the structure of FIG. 6d has greater flexibility than that shown in FIG. 6c at the price of two programming elements per connection rather than one. The number of programming elements is ½ the square of the number of pads. As the number of pads become larger (for example above 200 to 500 pads) this structure becomes relatively inefficient.

Figure 6E:
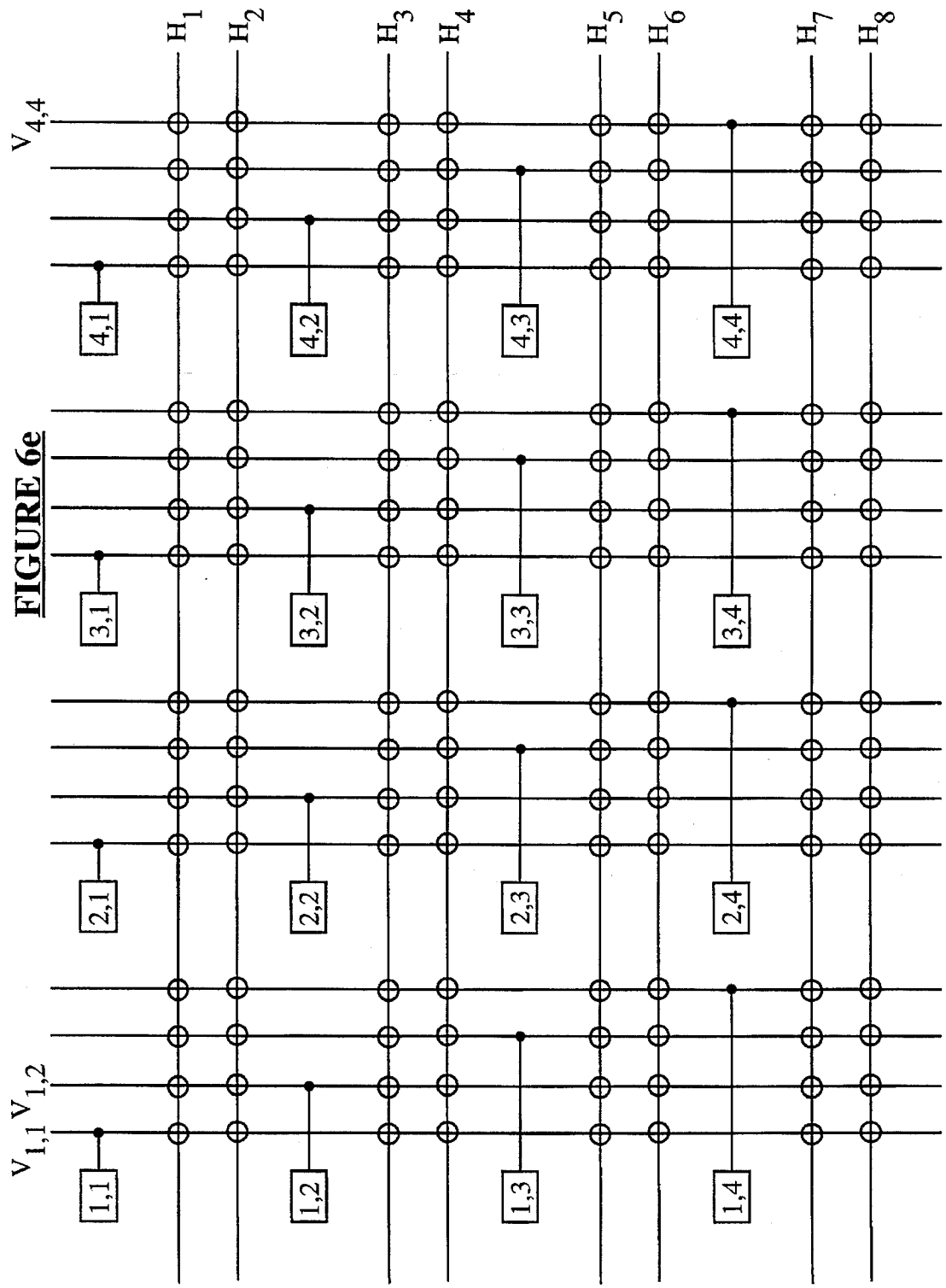

FIG. 6e illustrates the single switch cross-point matrix array of FIG. 6c with interconnections formed to connect pad 1,1 to pad 4,1. To do this, the intersection of the vertical lead $V_{1,1}$ and the horizontal lead $H_1$ is programmed as is the intersection of the vertical lead $V_{4,1}$ and horizontal lead $H_1$. Thus, two elements have been programmed to connect pads 1,1 and 4,1. To connect pad 1,2 to pad 4,4, the programming elements at the intersection of the vertical lead $V_{1,2}$, and the horizontal lead $H_3$ and of the horizontal lead $H_3$ and the vertical lead $V_{4,4}$ are programmed. Note that as a convention in FIG. 6e, wherever the intersection of a vertical and a horizontal lead is not shown to be electrically connected by a solid dot, a programmable element (often shown by a hollow circle) will be present even though a hollow circle is not shown at such intersection.

Figure 7A:
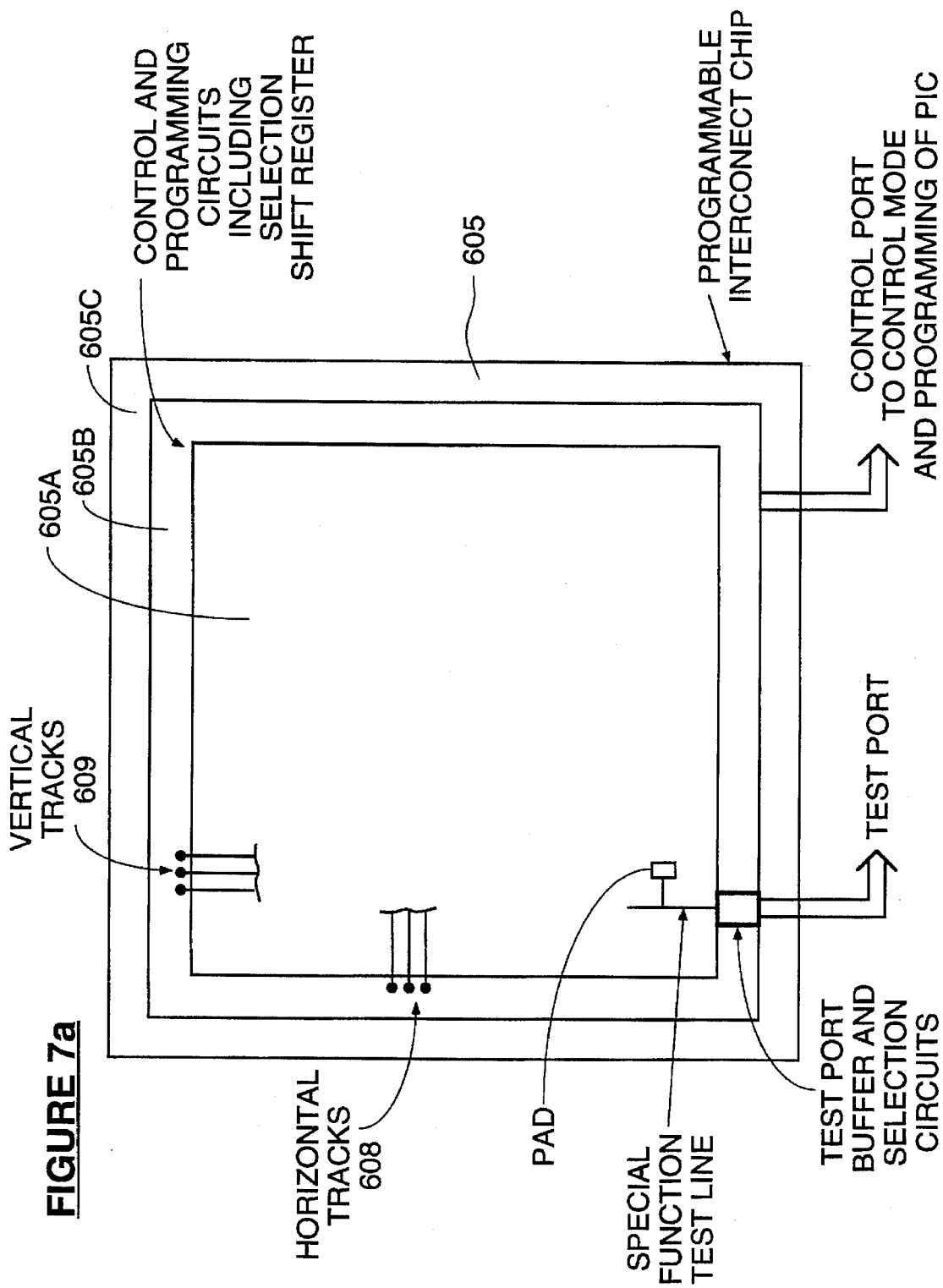
FIG. 7a illustrates the architecture of the programmable interconnect chip 605.

FIG. 7a shows in block diagram form the architecture of the programmable interconnect chip 605. The interior 605a of chip 605 contains the cells 606 (as described in conjunction with FIGS. 6a through 6e) and the horizontal and vertical tracks 608 and 609 respectively. In peripheral area 605b which forms an annular square around interior 605a are placed control and programming circuits including shift registers for selecting particular horizontal and vertical tracks the intersections of which are to be programmed. In addition, buffer circuitry for the test port bus and the control port bus is provided in this region of chip 605. Annular region 605c surrounds annular region 605b and contains additional circuitry essential to the operation of the chip such as mode selection circuitry which will determine whether the programmable interconnect chip is in the test mode, the operating mode or the programming mode. Additional special circuitry as required will also be placed in peripheral region 605c.

Figure 7B:
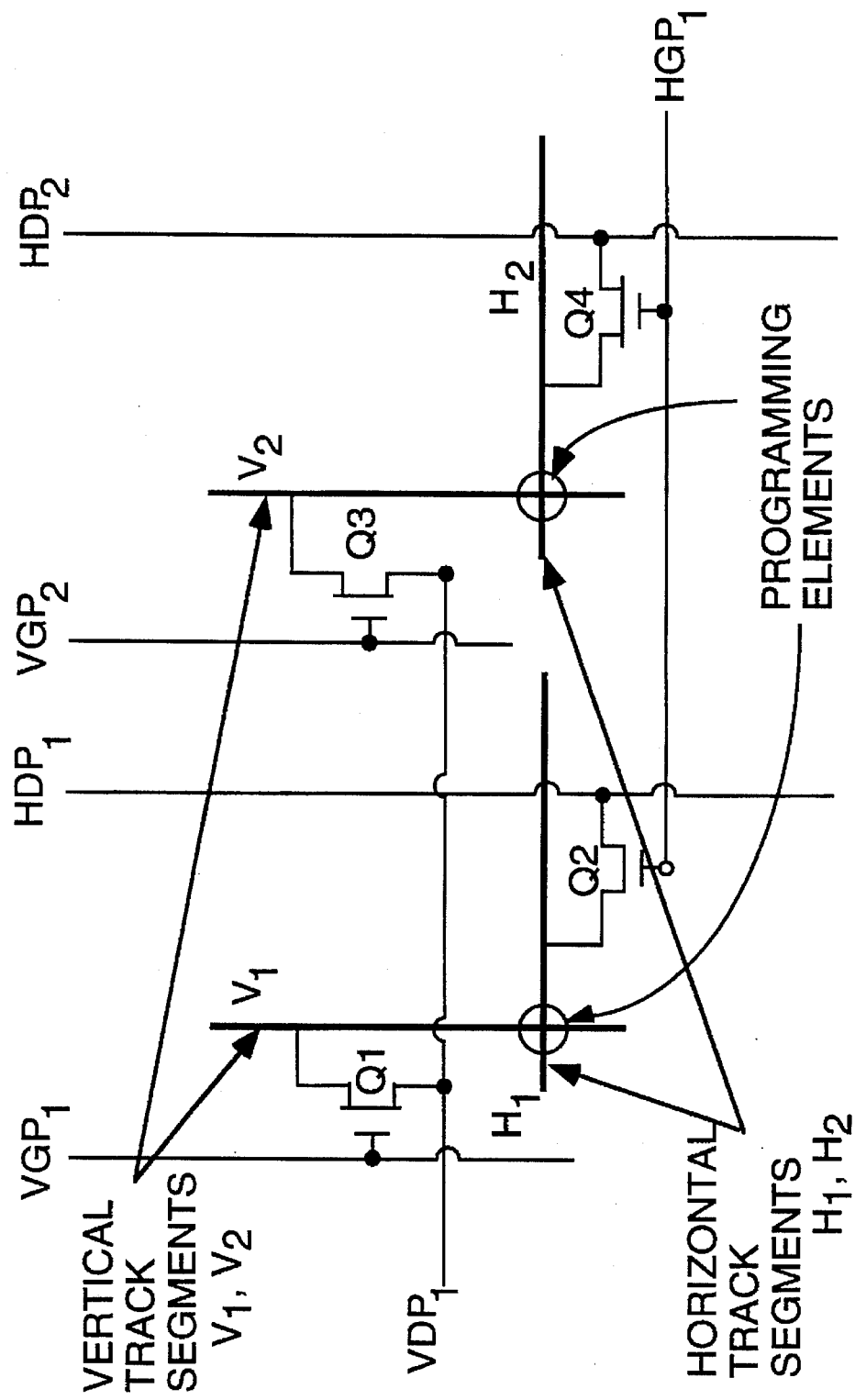
FIG. 7b illustrates one structure for programming the intersection of two conductive leads formed on the programmable interconnect chip 605.

FIG. 7b illustrates a programming structure and particularly programming transistors and circuits to select the intersection to be programmed of horizontal and vertical conductive leads on the programmable interconnect chip using only two transistors in the programming circuit path. Utilization of the structure shown in FIG. 7b allows the programming current to reach into the hundreds of milliamps to amperes range necessary to break down the dielectric between the vertical and horizontal conductive leads to form an interconnection therebetween with sufficiently low resistance. For example, to program the intersection of vertical conductive track $V_1$ and horizontal conductive track $H_1$, transistors Q1 and Q2 are provided. Transistor Q1 has its gate connected to voltage source $VGP_1$ and transistor Q2 has its gate connected to a voltage source $HGP_1$. The source of transistor Q1 is connected to vertical conductive track V1 while the drain of transistor Q1 is connected to conductive lead $VDP_1$. The source of transistor Q2 is connected to horizontal lead $H_1$ and the drain of transistor Q2 is connected to conductive lead $HDP_1$. To program the intersection of vertical lead $V_1$ and horizontal lead $H_1$, $VGP_1$ is applied to take the gate of Q1 to a high voltage $V_{GH}$, the gates of other transistors in the array such as transistor Q3 are held at zero volts and the drain voltage VDP1 on transistor Q1 is taken to $V_{PP}$. However, the gate voltage of Q4 is taken high because $HGP_1$ is taken to a high voltage to turn on transistor Q2. However, the voltage on the drain of Q2 is taken to zero volts by driving $HDP_1$ to zero and $HDP_2$ which applies a voltage to the drain of Q4 is taken to zero or to $V_{PP2}$ (which voltage is selected so as not to program the programming element at the intersection of $V_2$ and $H_2$. $V_{PP}$, the programming voltage, is typically 15 to 50 volts. $V_{GH}$, which is applied to lead $VGP_1$, is larger than $V_{PP}$ by the transistor threshold voltage and thus is approximately 18 to 53 volts. Because the devices Q1 to Q4 operate under high voltage, the threshold voltage of these transistors is made approximately 3 volts. As a result of the above-described voltages, only the programming element at the intersection of conductive lead segments H1 and V1 will receive the full programming voltage $V_{pp}$ and break down.

Figure 7C:
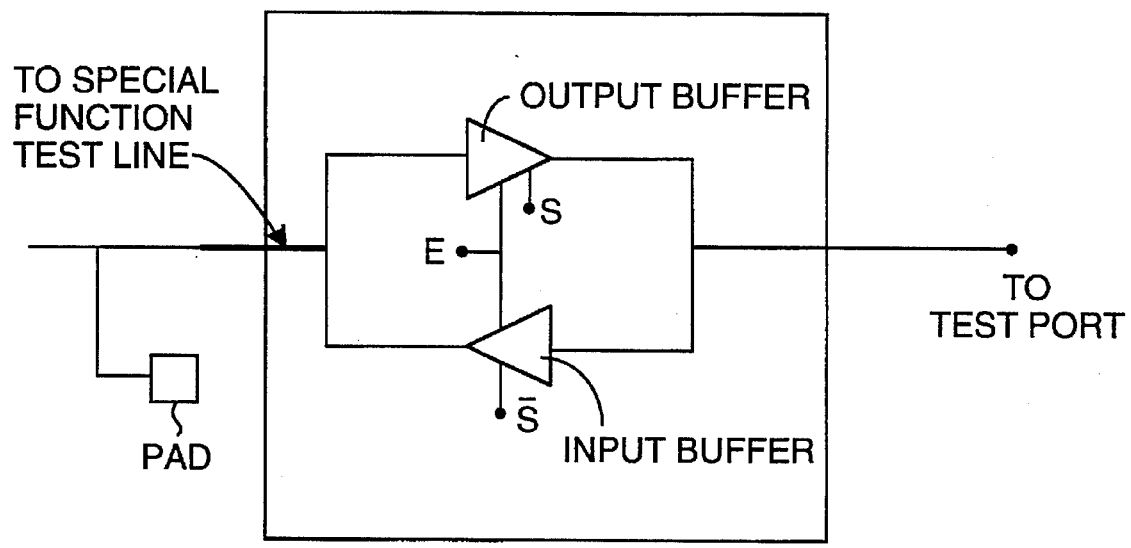
FIG. 7c illustrates a bilateral circuit for controlling the transmittal of signals to or from a test port used in conjunction with the programmable interconnect chip 605 of this invention.

FIG. 7c shows a bidirectional amplifying circuit capable of amplifying signals coming in either direction depending upon control signals applied to the input and output buffers contained within the circuitry. Thus, as shown in FIG. 7a, each pad on PIC 705 is connected to a special function test line (illustrated in FIG. 7c) and the special function test line is then capable of being connected to the test port by turning on the output buffer through a high level signal applied to the lead labeled S on the output buffer together with a high level enable signal applied on the terminal labeled E. Simultaneously with the application of a high level signal on the lead labeled S to the output buffer, a low level signal is applied to the lead labeled $\overline{S}$ to the input buffer thereby turning off the input buffer. Reverse polarity signals applied to terminals S and $\overline{S}$ result in the input buffer turning on and the output buffer turning off thereby allowing a signal from the test port to be applied to the pad. The S and E signals are transferred to the peripheral circuits in annular region 605b of FIG. 7a to select the pads on the PIC and the leads of the components on the FPPCB to connect to the test port.

Figure 8A:
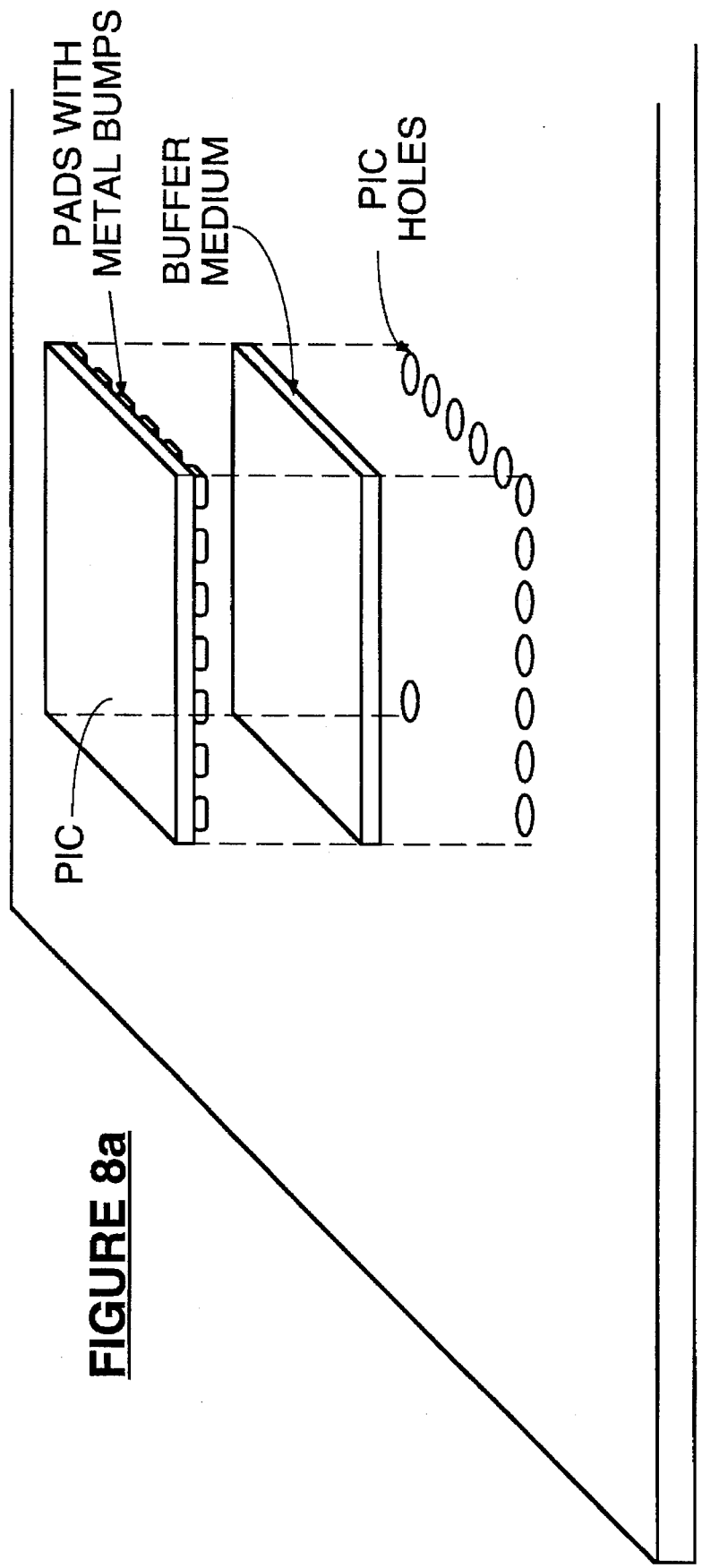

FIGS. 8a and 8b illustrate structures for attaching the program interconnect chip such as chip 105 in FIG. 1a to the PC board 100. FIG. 8a illustrates a program interconnect chip which contains pads with metal bumps shown in an exploded view above the PIC holes (corresponding to holes 104-1,1 through 104-R,C shown in FIG. 1b). A buffer medium comprising an elastomeric material which under pressure will conduct in the vertical direction but not the horizontal direction, is shown placed between the program interconnect chip and the PIC holes. The buffer medium could also be a carrier using button springs of a type well known in the art. This medium is a good buffer between the surface of the PIC and FFPPCB with their different surface flatness and temperature coefficient. The particular structure to be used to attach the programmable interconnect chip to the programmable PC board will depend upon the design requirements for the particular system utilizing the combination of programmable PC board and programmable interconnect chip and cost considerations.

FIG. 8b, which consists of FIGS. 8b1 and 8b2, shows an alternative structure for attaching the programmable interconnect chip such as chip 105 in FIG. 1a directly to a programmable printed circuit board such as board 100 in FIG. 1a. In FIG. 8b, the programmable interconnect chip has formed on one surface thereof a conductive pad to serve as an interface between a conductive element on the chip and a metal bump consisting of a soft solder such as lead tin placed on a nickel bottom layer. Alternatively, the whole bump is made of indium. The nickel is used to give strength to the bump. The programmable PC board has solder formed in the PIC hole so as to form a bump on the surface of the PC board to which the programmable interconnect chip is to be attached. The PIC hole such as hole 104-r,c in FIG. 1b, is plated typically with copper to a selected thickness such as 1 mil. The solder bump will, when the programmable interconnect chip is brought into pressure contact with the solder and the combined structure heated, form a solid contact with the metal bump. The two materials will wet and become one thus firmly securing and electrically connecting the programmable interconnect chip to the programmable printed circuit board. Solder bumps are well known in the art and thus this structure will not be described in greater detail. Other structures can be used to attach the programmable interconnect chip such as chip 105 in FIG. 1a directly to a programmable printed circuit board such as board 100 in FIG. 1a. Such structures include attachment of the PIC on the board and wire bonding of the pads on the PIC to the PIC holes. Any other structure known in the art to attach electronic components to a printed circuit board can be used with this invention and the structures described for this purpose are exemplary only.

In an alternative embodiment of this invention, a printed circuit board comprises a first portion containing conductive traces for interconnecting electronic components formed thereon without the use of a programmable integrated circuit and a second portion containing at least one programmable integrated circuit for interconnecting electronic components formed on at least the second portion of the printed circuit board. Electronic components formed on the second portion of the printed circuit board are in some cases interconnected with the electronic circuit formed on the first portion of the printed circuit board by conductive traces. These conductive traces typically will run from the first portion of the printed circuit board to at least one programmable integrated circuit for interconnecting electronic components formed on the second portion of the printed circuit board, thereby to electrically connect the second portion of the printed circuit board to the first portion of the printed circuit board.

Figure 9:
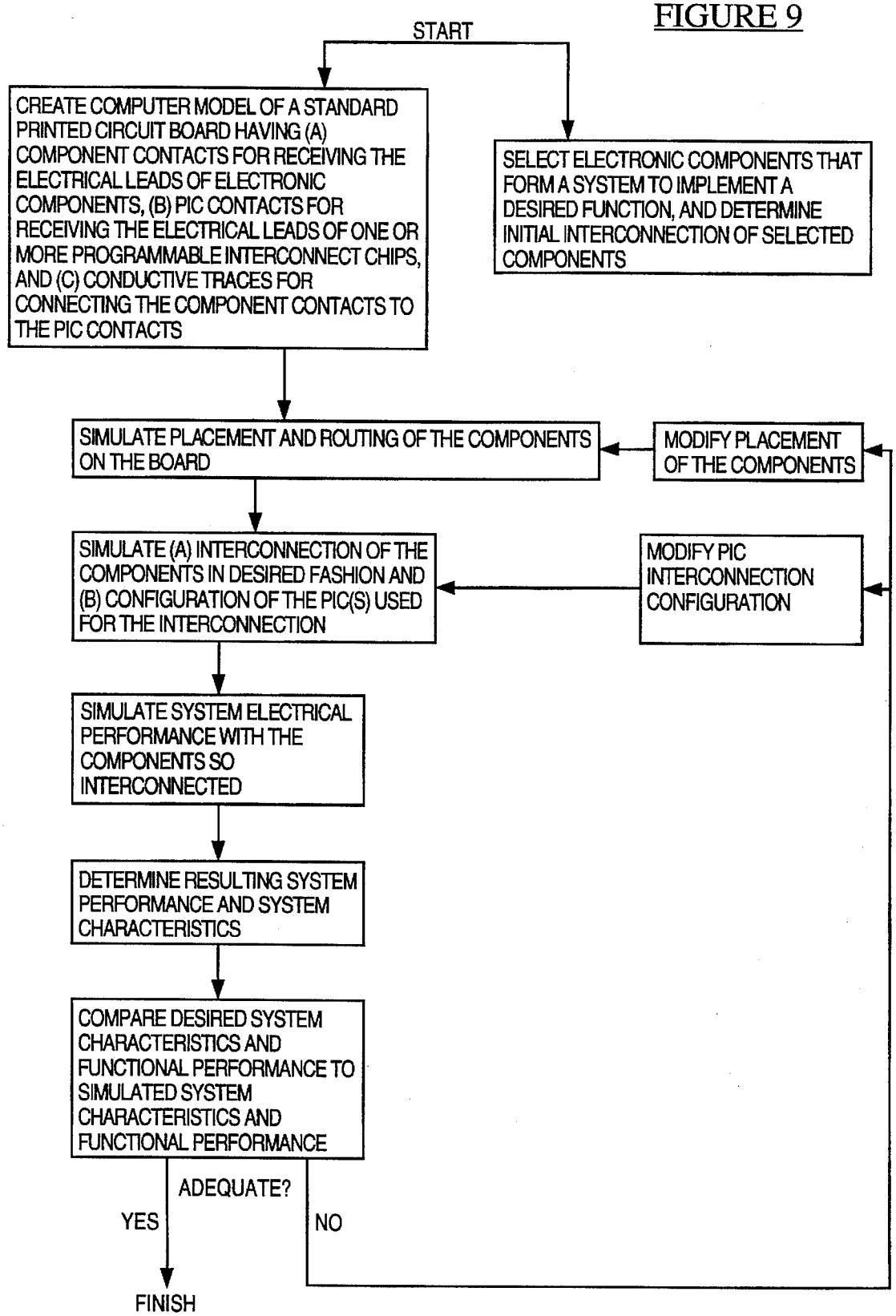
FIG. 9 is a flow chart depicting a method for designing an electronic system that employs the programmable PC board of this invention.

FIG. 9 illustrates how an electronic system utilizing the programmable PC board of this invention is designed. As indicated in FIG. 9, the designer first creates a computer model of the board in a computer aided design system. The designer then simulates placement of models of the desired electronic components, be they discrete elements, memory, logic gates, or microprocessors, on selected component contacts on the board and simulates the interconnection of these electronic components using the standard PC board of this invention together with the programmable interconnect chip or chips of this invention. The computer then simulates the electrical performance of the system with the electrical components so placed and interconnected and indicates whether or not the configuration selected by the designer yields the desired electronic function. The designer has choices in the placement of the electronic components on the programmable PC board and in their interconnection but is assisted in this placement by certain logical rules in the computer aided design program.

Algorithms for use in computer aided design systems of the type required to implement the design of electronic systems utilizing this invention are currently available in the electronic design industry. Examples of algorithms for partitioning and placement of the electronic components on the programmable PC board of this invention are described in (a) Lauther, "A Min-Cut Placement Algorithm for General Cell Assemblies Based on a Graph Representation," 16th Design Automation Conf., Jun. 25–27, 1979, pp. 1 –10, reprinted in *Comp. Paps. Design Automation Conf,* 1988, pp. 182–191, and (b) Fiduccia et al, "A Linear-Time Heuristic for Improving Network Partitions," 19th ACM/IEEE Design Automation Conf., Jun. 14–16, 1982, pp. 175–181 reprinted in ibid., pp. 241–247. Examples of algorithms for routing of the programmable interconnect chip(s) are described in (c) Marek-Sadowska, "Two Dimensional Router for Double Layer Layout," 22nd ACM/IEEE Design Automation Conf., Jun. 23–26, 1985, pp. 117–123, (d) Tzeng et al, "Codar: A Congestion-Directed General Area Router," IEEE Int'l Conf. on CAD, Nov. 7–10, 1988, pp. 30–33, (e) Lin et al, "A Detailed Router Based on Simulated Evolution," ibid., pp. 38–41, and (f) Lee et al, "A New Global Router for Row-Based Layout," ibid., pp. 180–183.

What is claimed is:

1. Structure comprising:

a substrate;

a plurality of component contacts formed on said substrate for receipt of electronic components;

a plurality of electrically conductive traces formed on said substrate, each conductive trace being electrically connected to a corresponding one of said component contacts; and at least one integrated circuit mounted on said substrate for testing said conductive traces and/or the electronic components to be mounted on selected ones of said component contacts, said at least integrated circuit having a layer of separate conductive leads extending in one direction, at least one of said conductive leads being divided into at least two electrically separate conductive segments.

2. Structure as in claim 1 wherein said substrate contains more than one layer of said conductive traces.

3. Structure as in claim 1 wherein said at least one integrated circuit contains active devices for performing tests.

4. Structure as in claim 1 wherein said conductive traces and said component contacts have a standard configuration independent of the electronic components to be mounted on said substrate.

5. Structure as in claim 1 wherein at least one of said conductive leads is electrically connected to a corresponding one of said conductive traces.

6. Structure as in claim 1 wherein said substrate comprises:

a first portion containing electrically conductive traces for interconnecting electronic components mounted thereon without the use of an integrated circuit; and a second portion containing said at least one integrated circuit for interconnecting electronic components mounted on at least said second portion.

7. Structure as in claim 1 wherein at least part of said component contacts comprise holes in said substrate, each hole being appropriate for receipt of a conductive lead of one of said electronic components.

8. Structure as in claim 1 wherein at least part of said component contacts comprise pads, each pad being connected to a corresponding one of said conductive traces.

9. Structure as in claim 1 wherein said substrate comprises a board suitable for carrying printed circuit traces.

10. Structure as in claim 1 wherein said at least one integrated circuit is operable to programmably interconnect selected ones of said conductive traces to achieve a desired electrical function from said electronic components.

11. Structure as in claim 1 wherein said at least one integrated circuit includes another layer of separate conductive leads extending in another direction, one of said layers overlying the other.

12. Structure as in claim 11 wherein at least one of said conductive leads in said another layer of conductive leads is divided into at least two electrically separate conductive segments.

* * * * *

UNITED STATES PATENT AND TRADEMARK OFFICE
CERTIFICATE OF CORRECTION

PATENT NO. : 5,661,409
DATED : August 26, 1997
INVENTOR(S) : Mohsen, Amr M.

It is certified that error appears in the above-identified patent and that said Letters Patent is hereby corrected as shown below:

Title page, item [54] and Col. 1

Delete the printed title and, in its place, insert --INTERCONNECT STRUCTURE CONTAINING INTEGRATED CIRCUIT FOR TESTING THE STRUCTURE--.

Delete the printed abstract and, in its place, insert
--A structure for interconnecting electronic components (506-1 - 506-4) is centered around a substrate (100 or 500) having a plurality of component contacts (102-1,1 - 102-R,C) for receiving the electronic components. A plurality of electrically conductive traces (103-1,1 - 103-R,C or 503-1 - 503-4) are provided on the substrate. Each conductive trace is electrically connected to a corresponding one of the component contacts. One or more integrated circuits (105, 505, or 605) having a layer of separate conductive leads (608-1 - 608-J) extending in one direction are mounted on the substrate for testing the conductive traces and/or the electronic components. At least one of the conductive leads is divided into two or more electrically separate conductive segments (618-1 - 618-3).--

UNITED STATES PATENT AND TRADEMARK OFFICE
CERTIFICATE OF CORRECTION

PATENT NO. : 5,661,409
DATED : August 26, 1997
INVENTOR(S) : Mohsen, Amr M.

It is certified that error appears in the above-identified patent and that said Letters Patent is hereby corrected as shown below:

Col. 1, line 4, after "This" insert --is a--.

Col. 4, line 4, change "13a" to --3a--.

Signed and Sealed this

Twenty-second Day of September, 1998

*Attest:*

BRUCE LEHMAN

*Attesting Officer*      *Commissioner of Patents and Trademarks*